United States Patent
Miñano et al.

(10) Patent No.: US 7,021,797 B2
(45) Date of Patent: Apr. 4, 2006

(54) OPTICAL DEVICE FOR REPOSITIONING AND REDISTRIBUTING AN LED'S LIGHT

(75) Inventors: Juan C. Miñano, Madrid (ES); Pablo Benitez, Madrid (ES); William A. Parkyn, Jr., Lomita, CA (US); Waqidi Falicoff, Newport Beach, CA (US)

(73) Assignee: Light Prescriptions Innovators, LLC, Irvine, CA (US)

( * ) Notice: Subject to any disclaimer, the term of this patent is extended or adjusted under 35 U.S.C. 154(b) by 2 days.

(21) Appl. No.: 10/461,557

(22) Filed: Jun. 12, 2003

(65) Prior Publication Data

US 2004/0228131 A1 Nov. 18, 2004

Related U.S. Application Data

(60) Provisional application No. 60/470,691, filed on May 13, 2003.

(51) Int. Cl.
*G02B 6/10* (2006.01)

(52) U.S. Cl. ............... 362/355; 362/559; 362/560; 362/309; 362/311; 385/146

(58) Field of Classification Search ............... 362/551, 362/555, 257, 296, 307–309, 311, 317, 326, 362/327, 329, 331, 332, 335, 559, 560, 355; 257/79, 88, 89, 98, 100; 313/110, 111, 113, 313/116; 315/76, 77; 385/146
See application file for complete search history.

(56) References Cited

U.S. PATENT DOCUMENTS

| 1,399,973 | A | | 12/1921 | Limpert |
| 1,977,689 | A | | 10/1934 | Muller |
| 2,254,961 | A | | 9/1941 | Harris |
| 2,362,176 | A | * | 11/1944 | Swanson ............... 313/110 |
| 2,908,197 | A | * | 10/1959 | Wells et al. ............ 362/337 |
| 3,760,237 | A | * | 9/1973 | Jaffe ..................... 257/98 |

(Continued)

FOREIGN PATENT DOCUMENTS

EP 0 450 560 A2 10/1991

(Continued)

OTHER PUBLICATIONS

U.S. Appl. No. 10/903,925, filed Jul. 20, 2004, Falicoff.

(Continued)

*Primary Examiner*—Thomas M. Sember
*Assistant Examiner*—Ismael Negron
(74) *Attorney, Agent, or Firm*—Thomas F. Lebens; Sinsheimer, Schiebelhut & Baggett

(57) ABSTRACT

An optical device is for spatially displacing the output of a light-emitting diode (LED) and coupling the output to a predominantly spherical emission pattern produced at a useful height above the LED. The device is made of a transparent dielectric material, such as an injection-molded plastic. It comprises a lower transfer section that receives the LED's light from below and an upper ejector section that receives the transferred light and spreads it spherically. One or more LEDs. are optically coupled to the bottom of the transfer section, which operates by total internal reflection upon their entire hemispherical emission. One embodiment operates as a flashlight-bulb substitute with the ejector section radiating onto a parabolic reflector, which forms the beam. Thus hemisphencally emitting LEDs can be used in parabolic-mirror flashlights wherein these LEDs by themselves may be unsuitable for that role.

21 Claims, 22 Drawing Sheets

U.S. PATENT DOCUMENTS

| | | |
|---|---|---|
| 3,774,021 A | 11/1973 | Johnson |
| 3,938,177 A | 2/1976 | Hansen et al. |
| 4,192,994 A | 3/1980 | Kastner |
| 4,211,955 A * | 7/1980 | Ray ........................... 315/205 |
| 4,337,759 A | 7/1982 | Popovich et al. |
| 4,342,908 A | 8/1982 | Henningsen et al. |
| 4,388,673 A * | 6/1983 | Maglica ...................... 362/253 |
| 4,464,707 A * | 8/1984 | Forrest ...................... 362/222 |
| 4,638,343 A * | 1/1987 | Althaus et al. ................ 257/98 |
| 4,675,725 A | 6/1987 | Parkyn |
| 4,698,730 A | 10/1987 | Sakai et al. |
| 4,727,289 A * | 2/1988 | Uchida ........................ 315/71 |
| 4,727,457 A | 2/1988 | Thillays |
| 4,920,404 A | 4/1990 | Shrimali et al. |
| 5,055,892 A | 10/1991 | Gardner et al. |
| 5,140,220 A | 8/1992 | Hasegawa |
| 5,302,778 A | 4/1994 | Maurinus |
| 5,335,157 A | 8/1994 | Lyons |
| 5,343,330 A | 8/1994 | Hoffman et al. |
| 5,404,282 A | 4/1995 | Klinke et al. |
| 5,404,869 A | 4/1995 | Parkyn, Jr. et al. |
| 5,438,453 A | 8/1995 | Kuga |
| 5,452,190 A | 9/1995 | Priesemuth |
| 5,528,474 A | 6/1996 | Roney et al. |
| 5,557,471 A | 9/1996 | Fernandez |
| 5,577,492 A | 11/1996 | Parkyn et al. |
| 5,580,142 A | 12/1996 | Kurematsu et al. |
| 5,608,290 A | 3/1997 | Hutchisson et al. |
| 5,613,769 A | 3/1997 | Parkyn et al. |
| 5,655,830 A * | 8/1997 | Ruskouski ................... 362/240 |
| 5,655,832 A | 8/1997 | Pelka et al. |
| 5,676,453 A | 10/1997 | Parkyn, Jr. et al. |
| 5,757,557 A * | 5/1998 | Medvedev et al. ......... 359/708 |
| 5,777,433 A | 7/1998 | Lester et al. |
| 5,806,955 A | 9/1998 | Parkyn, Jr. et al. |
| 5,813,743 A | 9/1998 | Naka |
| 5,865,529 A * | 2/1999 | Yan ........................... 362/327 |
| 5,894,195 A * | 4/1999 | McDermott ................ 362/339 |
| 5,894,196 A | 4/1999 | McDermott |
| 5,897,201 A | 4/1999 | Simon |
| 5,898,267 A | 4/1999 | McDermott |
| 5,898,809 A | 4/1999 | Taboada et al. |
| 5,924,788 A | 7/1999 | Parkyn |
| 5,926,320 A | 7/1999 | Parkyn et al. |
| 5,966,250 A | 10/1999 | Shimizu |
| 6,019,493 A * | 2/2000 | Kuo et al. ................... 362/335 |
| 6,030,099 A | 2/2000 | McDermott |
| 6,044,196 A | 3/2000 | Winston et al. |
| 6,048,083 A | 4/2000 | McDermott |
| 6,139,166 A | 10/2000 | Marshall et al. |
| 6,166,860 A | 12/2000 | Medvedev et al. |
| 6,166,866 A | 12/2000 | Kimura et al. |
| 6,177,761 B1 | 1/2001 | Pelka et al. |
| 6,181,476 B1 | 1/2001 | Medvedev |
| 6,201,229 B1 | 3/2001 | Tawa et al. |
| 6,268,963 B1 | 7/2001 | Akiyama |
| 6,273,596 B1 | 8/2001 | Parkyn |
| 6,282,821 B1 | 9/2001 | Freier |
| 6,301,064 B1 | 10/2001 | Araki et al. |
| 6,350,041 B1 | 2/2002 | Tarsa et al. |
| 6,361,190 B1* | 3/2002 | McDermott ................ 362/310 |
| 6,450,661 B1 | 9/2002 | Okumura |
| 6,473,554 B1 | 10/2002 | Pelka et al. |
| 6,483,976 B1 | 11/2002 | Shie et al. |
| 6,488,392 B1* | 12/2002 | Lu ............................. 362/308 |
| 6,502,964 B1 | 1/2003 | Simon |
| 6,504,301 B1* | 1/2003 | Lowery ...................... 313/512 |
| 6,536,923 B1 | 3/2003 | Merz |
| 6,547,400 B1 | 4/2003 | Yokoyama |
| 6,547,423 B1 | 4/2003 | Marshall et al. |
| 6,560,038 B1 | 5/2003 | Parkyn et al. |
| 6,578,989 B1 | 6/2003 | Osumi et al. |
| 6,580,228 B1* | 6/2003 | Chen et al. .................. 362/294 |
| 6,582,103 B1 | 6/2003 | Popovich et al. |
| 6,598,998 B1 | 7/2003 | West et al. |
| 6,603,243 B1 | 8/2003 | Parkyn et al. |
| 6,607,286 B1 | 8/2003 | West et al. |
| 6,616,287 B1 | 9/2003 | Sekita et al. |
| 6,621,222 B1* | 9/2003 | Hong .......................... 315/51 |
| 6,637,924 B1 | 10/2003 | Pelka et al. |
| 6,639,733 B1 | 10/2003 | Minano et al. |
| 6,646,813 B1 | 11/2003 | Falicoff |
| 6,647,199 B1 | 11/2003 | Pelka et al. |
| 6,674,096 B1 | 1/2004 | Sommers |
| 6,679,621 B1 | 1/2004 | West |
| 6,688,758 B1 | 2/2004 | Thibault |
| 6,786,625 B1* | 9/2004 | Wesson ...................... 362/545 |
| 6,796,698 B1* | 9/2004 | Sommers et al. ........... 362/555 |
| 6,803,607 B1* | 10/2004 | Chan et al. ................... 257/98 |
| 6,811,277 B1 | 11/2004 | Amano |
| 2002/0034012 A1 | 3/2002 | Santoro et al. |
| 2002/0080623 A1 | 6/2002 | Pashley |
| 2003/0076034 A1 | 4/2003 | Marshall |
| 2004/0070855 A1 | 4/2004 | Benitez |
| 2004/0105171 A1 | 6/2004 | Minano |
| 2004/0189933 A1 | 9/2004 | Sun |
| 2005/0117125 A1 | 6/2005 | Minano et al. |
| 2005/0129358 A1 | 6/2005 | Minano et al. |

FOREIGN PATENT DOCUMENTS

| | | |
|---|---|---|
| ES | 2142752 | 12/2000 |
| SU | 1282051 A1 | 7/1987 |
| WO | WO 99/09349 | 2/1999 |
| WO | WO 99/13266 | 3/1999 |
| WO | WO 01/07828 A1 | 2/2001 |
| WO | WO 03/066374 A2 | 8/2003 |
| WO | WO 03/066374 A3 | 8/2003 |
| WO | WO 2004/007241 A2 | 1/2004 |

OTHER PUBLICATIONS

U.S. Appl. No. 10/901,919, filed Jul. 28, 2004, Benitez.
U.S. Appl. No. 10/851,471, filed May 21, 2004, Benitez et al.
U.S. Appl. No. 10/880,386, filed Jun. 28, 2004, Benitez et al.
Benitez, P. "Chapter 6: The SMS design method in three dimensions", from *Conceptos avanzados de óptica anidólica: diseño y fabricación*, PhD dissertation, UPM, (1998).
Benitez, P.: Mohedano, R; Minano, J. "Design in 3D geometry with the Simultaneous Multiple Surface design method of Nonimaging Optics" Instituto de Engergia Solar, E.T.S.I. Telecommunicacion, Universidad Politecnica, 28040. Madrid, Spain. (Jul. 1999).
International Search Report, PCT/US03/38240, Jul. 26, 2004.
U.S. Appl. No. 10/814,598, filed Mar. 30, 2004, Chaves et al.
U.S. Appl. No. 10/816,228, filed Mar. 31, 2004, Chaves et al.
International Serach Report. PCT/US03/32076. Apr. 20, 2004.
U.S. Appl. No. 10/269,479, filed Oct. 11, 2002, Benitez.
U.S. Appl. No. 10/622,874, filed Jul. 16, 2003, Minano.
U.S. Appl. No. 10/726,130, filed Dec. 1, 2003, Sun.
U.S. Appl. No. 10/772,088, filed Feb. 3, 2004, Minano et al.
U.S. Appl. No. 10/779,259, filed Feb. 13, 2004, Benitez.
Remillard, Everson and Weber, "Loss Mechanisms Optical Light Pipes" *Applied Optics* vol. 31 #34 pp. 7232-7241 Dec. 1992.

Parkyn et al The Black Hole™: Cuspated waveguide-injectors and illuminators for LEDs; Part of the SPIE Conference on Nonimaging Optics: Maximum Efficiency Light Transfer V, Denver, CO, Jul. 1999.

Hyper ARGUS®LED, Hyper-Bright, 3mm (T1) LED, Non Diffused; Mar. 1, 2000; Infineon Technologies, pp. 1-9.

Spigulis, "Compact dielectric reflective elements, Half-sphere concentrators of radially emitted light" *Applied Optics* vol. 33, No. 25, Sep. 1994.

International Search Report, PCT/US03/38024, Nov. 10, 2004.

International Search Report, PCT/US04/14938, Mar. 1, 2005.

International Search Report, PCT/US04/38584, mailed Jul. 18, 2005.

International Search Report, PCT/US04/24450, mailed Aug. 3, 2005.

\* cited by examiner

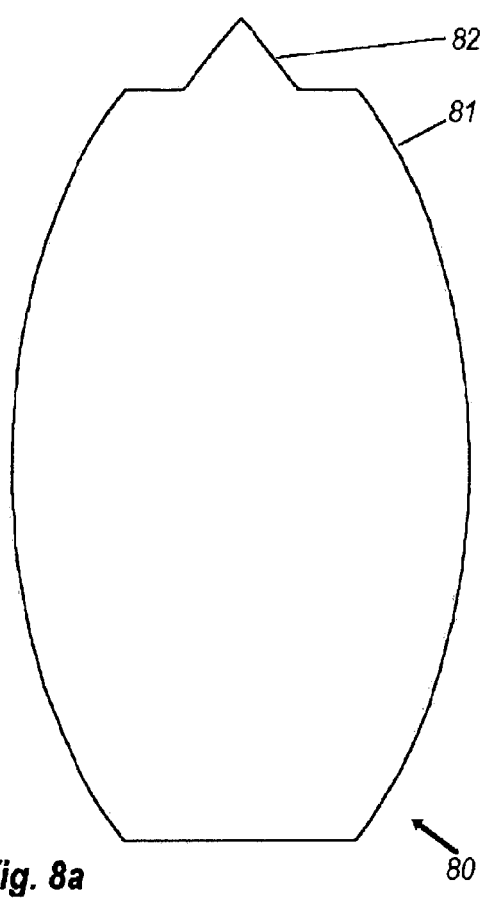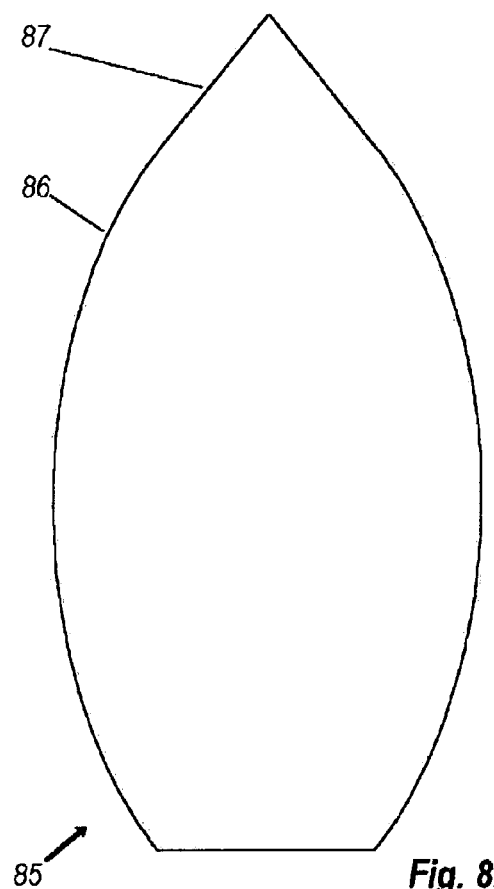
Fig. 8a
Fig. 8b

Fig. 21a
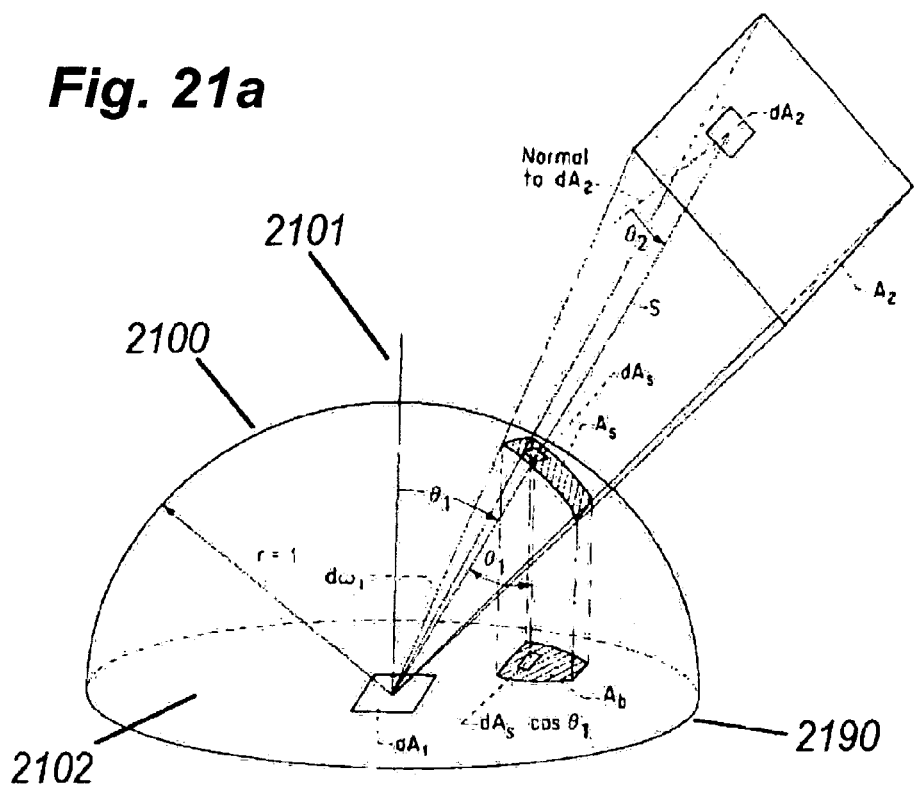
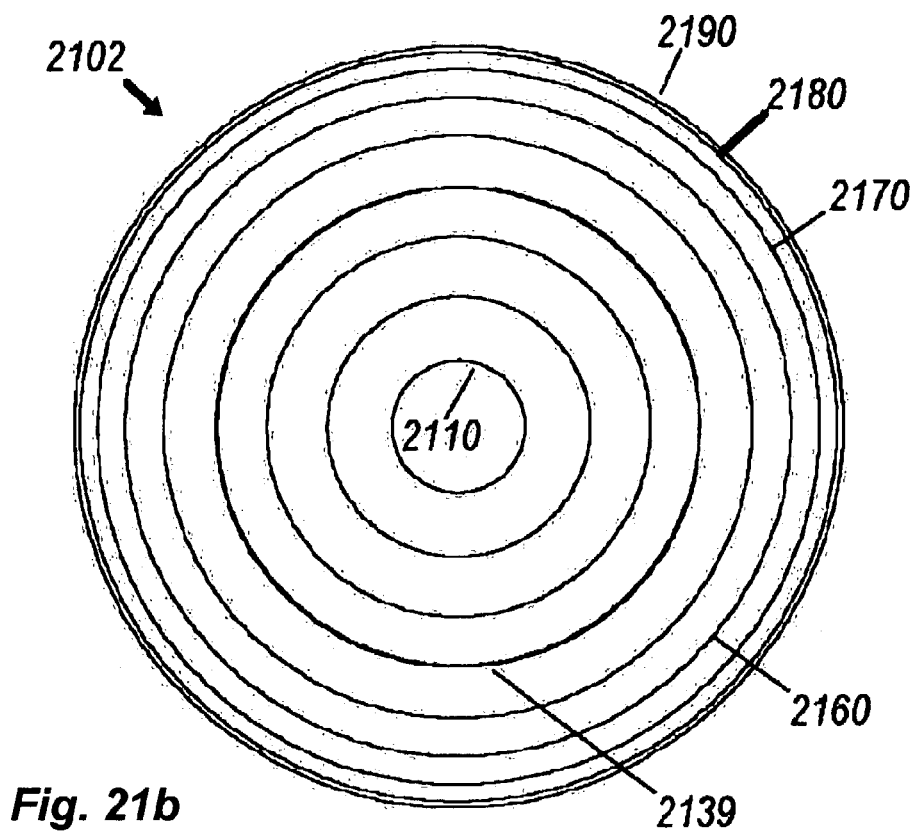
Fig. 21b

US 7,021,797 B2

OPTICAL DEVICE FOR REPOSITIONING AND REDISTRIBUTING AN LED'S LIGHT

This application claims priority under 35 U.S.C. 119(e) to U.S. Provisional Patent Application No. 60/470,691 filed May 13, 2003, of Juan C. Minano et al., for OPTICAL DEVICE FOR LED-BASED LIGHT-BULB SUBSTITUTE, which United States provisional patent application is hereby fully incorporated herein by reference.

BACKGROUND OF THE INVENTION

The present invention relates to light-emitting diodes (LEDs), particularly optical means for substituting white LEDs for incandescent and fluorescent light bulbs.

Conventional incandescent lamps of less than 100 lumens output can be matched by the latest white LEDs, albeit at a higher price. At this low end of the lumen range, the majority of incandescent applications are battery-powered. It is desirable to have an LED suitable for direct installation in the place of, for example, a burnt-out flashlight bulb.

LED's can offer superior luminous efficacy over the conventional incandescent lamps used in, for example, battery-operated flashlights. Moreover, LEDs are far more tolerant of shock, vibration, and crush-stress. Although they currently cost more to produce than the incandescents, their lifetimes are ten thousand times longer. For the sake of efficacy, flashlight bulbs are run hot so they typically last only a few hours until filament failure. Also, the prices of LEDs continue to fall, along with those of the control-electronics to handle variations in battery voltage.

Indeed, LED flashlights are commercially available already, but their optics have to be adapted to the geometry of light-emitting diodes, which only emit into a hemisphere. Conventional LED lamps are unsuitable for direct installation into conventional flashlights, both electrically and optically. LED lamps are electrically unsuitable because they are current-driven devices, whereas batteries are voltage sources. Typical variations in the voltage of fresh batteries are enough to exceed an LED's tolerable operating-voltage range. This causes such high currents that the Ohmic heating within the die of the LED lamp exceeds the ability of thermal conduction to remove it, causing a runaway temperature-rise that destroys the die. Therefore, a current-control device must accompany the LED lamp.

Conventional LED lamps are optically unsuitable for direct installation into the parabolic reflectors of flashlights. This is because their bullet-lens configuration forms a narrow beam that would completely miss a nearby parabolic reflector typical of flashlights. Using instead a hemispherically emitting non-directional dome, centered on the luminous die, gives the maximum spread commercially available, a Lambertian pattern, with a $\sin^2\theta$ dependence of encircled flux on angle θ from the LED lamp center axis. Since θ for a typical parabolic flashlight reflector extends from 45° to 135°, an LED lamp with a hemispheric pattern is mismatched because it's emission falls to zero at only θ=90°. This results in a beam that is brightest on the outside and completely dark halfway in. Worse yet, even this inferior beam pattern from a hemispheric LED would require that it be held up at the parabola's focal point, several millimeters above the socket wherein a conventional incandescent bulb is installed.

Another type of battery-powered lamp utilizes cylindrical fluorescent lamps. Although LEDs do not improve on their luminous efficacy, fluorescent lamps are relatively fragile and require high voltages.

There is thus a need in the art for an effective, low voltage and optically suitable LED lamp with which current incandescent bulb flashlights can be retrofitted by direct installation of the LED lamp into the parabolic reflectors of current flashlights.

SUMMARY OF THE INVENTION

The present invention advantageously addresses the needs above as well as other needs by providing an optical device for an LED-based light-bulb substitute, with preferred embodiments substituting for both incandescent and fluorescent lamps.

In one embodiment, the invention can be characterized as an optical device for distributing the radiant emission of a light emitter comprising a lower transfer section and an upper ejector section situated upon the lower transfer section. The lower transfer section is operable for placement upon the light emitter and operable to transfer the radiant emission to said upper ejector section. The upper ejector section shaped such that the emission is redistributed externally into a substantial solid angle.

In another embodiment, the invention can be characterized as an optical device for distributing the radiant emission of a light emitter, comprising multiple off-axis ellipsoids made of substantially transparent material. The ellipsoids are truncated at a focal point of each ellipsoid and they are coupled longitudinally to each other to provide a totally internally reflecting channel.

In another embodiment, the invention can be characterized as an optical device for distributing radiant emission of a light emitter having an expander section and a cylindrical ejector section. The expander section is made of substantially transparent material and is operable for receiving said radiant emission and narrowing said radiant emission's angular range to that of light guiding via total internal reflection. The cylindrical ejector section is coupled to the expander section and is made of substantially transparent material having graded sub-wavelength roughness on a surface of the cylindrical ejector section and is operable for receiving and ejecting the angularly narrowed radiation.

A better understanding of the features and advantages of the present invention will be obtained by reference to the following detailed description of the invention and accompanying drawings, which set forth an illustrative embodiment in which the principles of the invention are utilized.

BRIEF DESCRIPTION OF THE DRAWINGS

The above and other aspects, features and advantages of the present invention will be more apparent from the following more particular description thereof, presented in conjunction with the following drawings wherein:

FIGS. 8a and 8b are side views of cone-topped optical devices according to alternative embodiments of the present invention;

FIG. 21a is a diagram of a unit sphere of directions depicting a method of calculating radiant reception by the method of the unit sphere of direction;

FIG. 21b is a diagram showing an equatorial plane of the same unit sphere of FIG. 21a, with circles of sin θ from 10 to 90° from the local surface normal inside a cylinder;

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
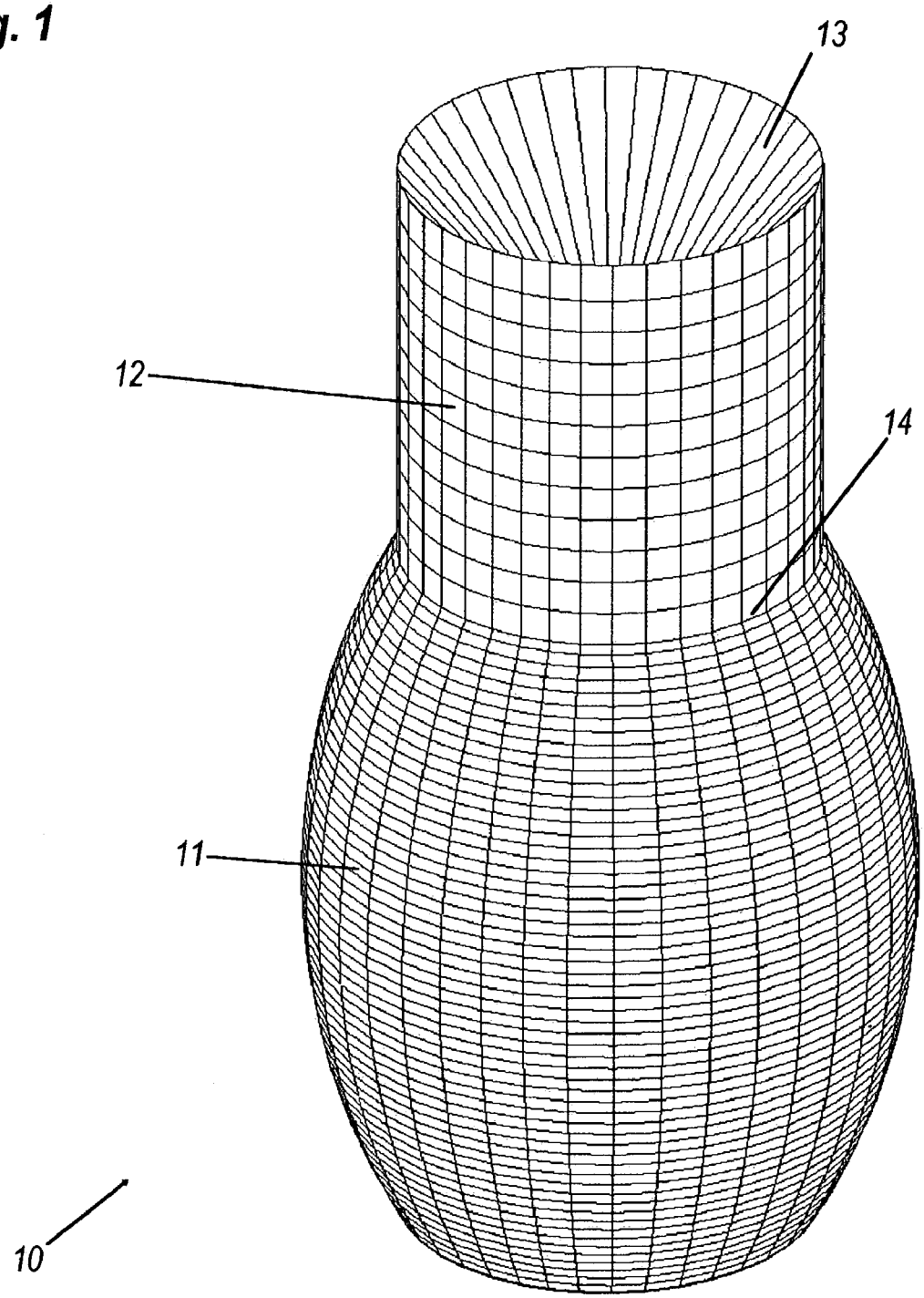
FIG. 1 is a top perspective view of an optical device according to an embodiment of the present invention.

Referring to FIG. 1, shown is top perspective view of an optical device according to an embodiment of the present invention. Lens 10 comprises lower transfer section 11 and upper ejector section 12.

The lens 10 is a transparent solid in the general shape of a prolate ellipsoid and is single piece of a transparent material such as acrylic or polycarbonate. It has a rotationally symmetric shape, taller than its diameter. Upper ejector section 12 is cylindrical, with a conical indentation 13 on top of it. Exit plane 14 is the boundary between transfer section 11 and ejector section 12.

The lower transfer section 11 uses internal reflection to relocate an LED's emission upward to a parabola's focal point.

The upper ejector section is shaped such that the light within it is redistributed out an external surface of the upper ejector section into a solid angle substantially greater than a hemisphere, and approximating that of an incandescent flashlight bulb. The ejector section must be positioned at the same height as a glowing filament of a light bulb it replaces. It is easier to optically move this emission point, using the transfer section, than to put an LED itself at such a height, which would make heat transfer difficult, among other problems that the present invention advantageously addresses.

The upper ejector section sends the transferred light out to a parabolic reflector 40 (as described below and shown in FIG. 4), sideways and downward at angles to the axis extending all the way to at least 135°, or a little more, depending upon the reflector. At least half the ejected light should be at angles over 45°, in order to illuminate the reflector and form a sufficiently intense collimated beam.

In order to avoid an external reflective coating on the surface of the transfer section 11, the geometry of the transfer section 11 must promote total internal reflection. This is why polycarbonate, with its higher refractive index (1.5855), is preferable to acrylic (1.492). Its correspondingly smaller critical angle, $\theta_c = \sin^{-1}(1/n)$, of 39.°103 vs. 42.°1, reduces the height of the transfer section from 23.5 mm to 11.6 mm.

Figure 2:
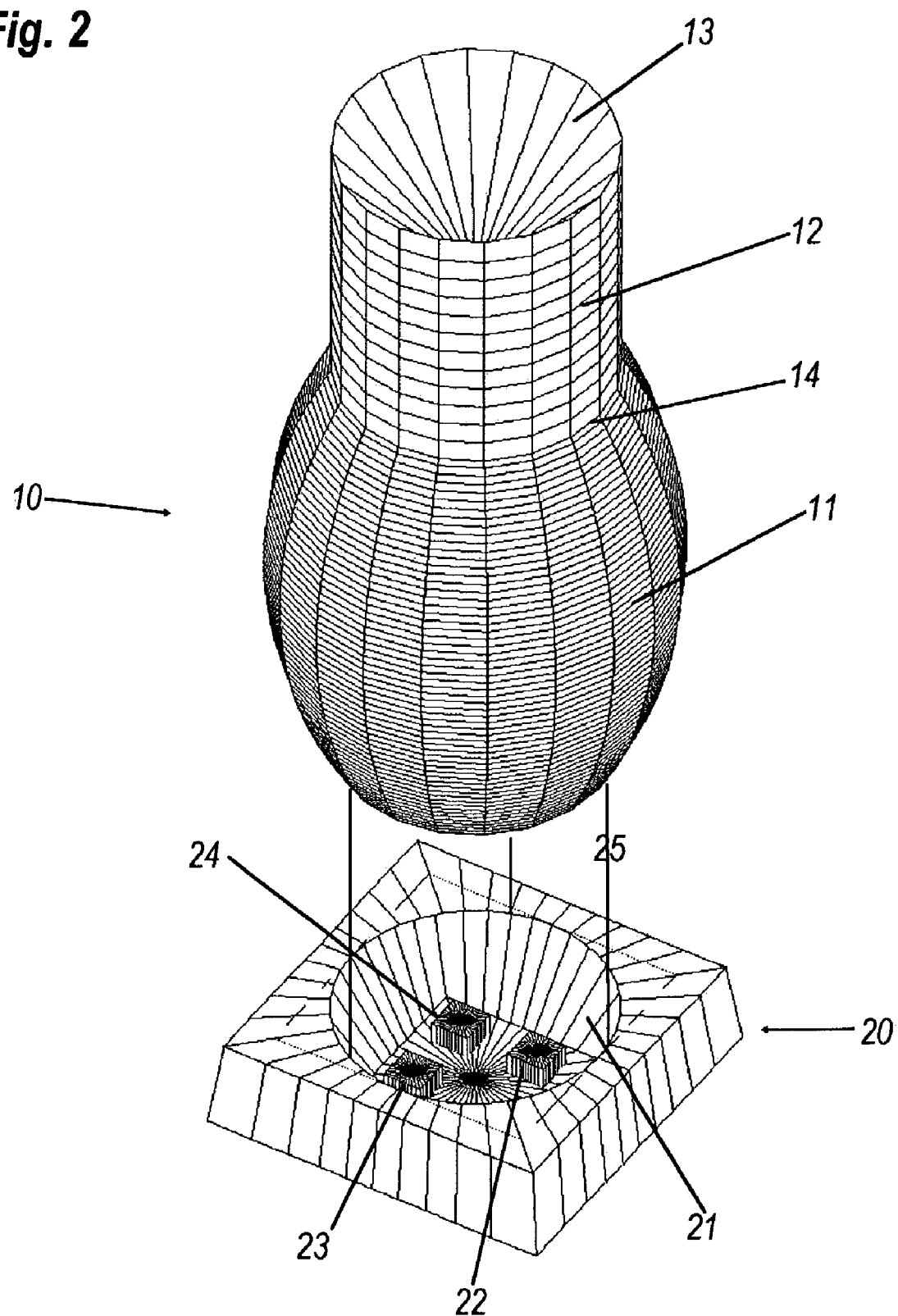
FIG. 2 is an exploded top perspective view of an optical device according to an embodiment of the present invention incorporating the device of FIG. 1.

Referring next to FIG. 2, shown is an exploded top perspective view of an optical device according to an embodiment of the present invention incorporating the device of FIG. 1. Shown are the lens 10 which is circularly-symmetric, and an LED package 20.

The LED package 20 comprises a diffusely white reflector cup 21, filled with transparent epoxy; light-emitting diode chips 22, 23, and 24, colored red, green, and blue, and balanced to mix into a white hue of selectable color temperature. This selection of color temperature is accomplished via the relative luminosities of the three chips 22, 23, and 24. The bottom diameter of the lens 10 matches the top diameter of reflector cup 21, with lines 25 showing a path of joining the lens 10 and the reflector cup 21. All the light from the LED package 20 is injected into the lens 10, and is totally internally reflected therein to cross exit plane 14 and enter the ejector section 12. The LED package 20 completely fills the bottom of the lens 10. In other embodiments, this optical filling might be incomplete, in order for the lens 10 to be joined wit a pro-existing commercial LED package. As long as the focus of the elliptic profile is on the luminous perimeter of the LED package, the lens 10 intercepts all light from the LED package.

Figure 3:
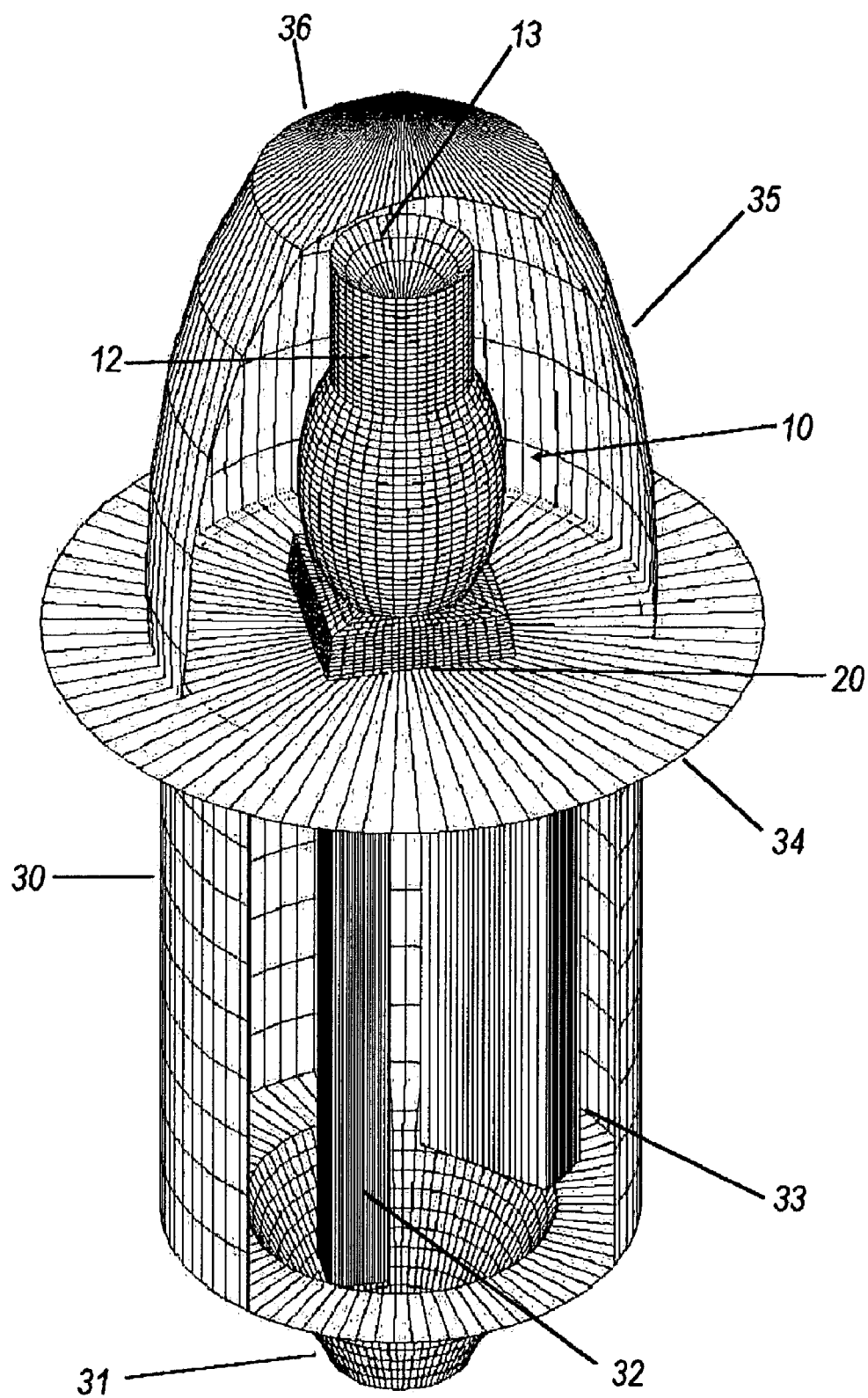
FIG. 3 is a top perspective view of an optical device according to an embodiment of the present invention shown in cutaway and incorporating the device of FIG. 2.

Referring next to FIG. 3, shown is atop perspective view of an optical device, according to an embodiment of the present invention, shown in cutaway and incorporating the device of FIG. 2. FIG. 3 shows the device of FIG. 2 installed in a light-bulb substitute. Shown are the lens 10, the LED package 20, the base can 30, LED control circuitry on a board 33 with a heat removing power coupler 32, a collar 34, and a transparent glass bulb 35.

The lens 10 and the LED package 20 are mounted on the base can 30, shown in cutaway to reveal interior components. These include the board 33, having LED control circuitry, with the heat removing power coupler 32 connecting to an electrically isolated bottom nub 31, which is customarily the positive polarity point on identically configured incandescent flashlight bulbs, while the negative proceeds through collar 34, on which the LED package 20 is mounted. Protectively enclosing the lens 10 and the LED package 20 is a transparent glass bulb 35, shown in cutaway. Unlike an incandescent bulb, the glass bulb 35 of the present embodiment needs no vacuum seal, so that there are none of the elevated temperatures of bulb-forming and sealing with molten glass, as there are with incandescent bulb formation. The bulb 35 preferably has a front lens 36 for beam-forming of forward rays from the lens 10.

Not only does the bulb 35 protect the lens 10 from being knocked loose from its bond with the LED package 20 during handling and from getting dirty in operation, but it also makes the entire device completely similar to the incandescent bulbs it is replacing. In this case, however, the glass in 35 will not be hot. Instead, the collar 34 will provide a heat path for the LED package 20.

Yet another function of the bulb 35 is color mixing. During luminous operation of the LED package 20, close scrutiny of the lens 10 will reveal numerous small colored sparkles that are tiny images of spots on each of the three colored chips (i.e. in FIG. 2, chips 22, 23, and 24). Although such sparides may prove to be aesthetically attractive, if suppressing them is desired then a diffuser on the surface of the bulb 35 could provide just enough of a haze effect as to blur out such sparkles into unifona whiteness. Such diffusers can be formed directly by the mold that manuthctures the bulb 35, through transfer of a diffuser pattern (which can be holographically generated) onto the metal of the mold. The holographic diffusers operate diffractively upon transmitted light and have high forward-scattering efficiency (i.e., very little light is scattered backwards).

The base can 30 is mechanically and electrically compatible with the sockets for incandescent lamps and contains built-in current-control and heat-removing power coupler 32 such as a copper rod (not shown) on board 33 to protect the light emitting diode chips as well as enable higher currents to be used for greater die luminosity.

Figure 4:
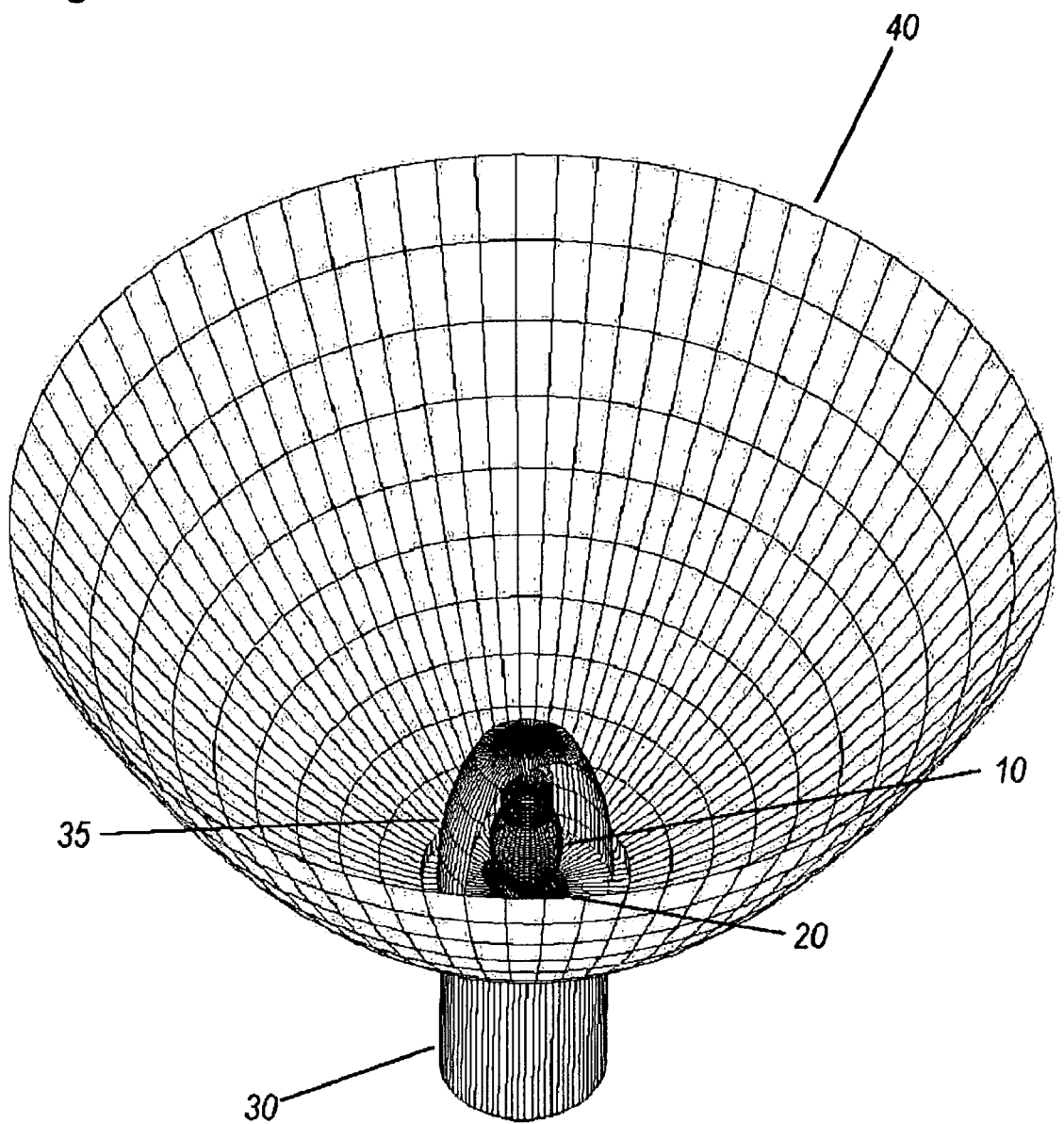
FIG. 4 is a top perspective view of an optical device according to an embodiment of the present invention incorporating the device of FIG. 3.

Referring next to FIG. 4, shown is a top perspective view of an optical device according to an embodiment of the present invention incorporating the device of FIG. 3. FIG. 4 depicts the device of FIG. 3 installed in parabolic reflector 40, such that the upper part of the lens 10 is at a focus of the parabolic reflector 40. The base can 30 is shaped and electrically configured to be substantially similar to the incandescent light bulb it replaces.

At least half of the luminous emission from the device is directed into the side angles filled by the parabolic reflector 40, typically 45° to 135° from the axis of the parabolic reflector 40. The remainder of the luminous emission is sent forward and not returned to the die. Above the base can 30, the bulb 35 and the lens 10 are approximately the same size as the incandescent lamp the device replaces, with its main emission center near the focal point of the parabolic reflector 40. This is typically near the top of the incandescent lamp, in lowest-cost designs.

Figure 5:
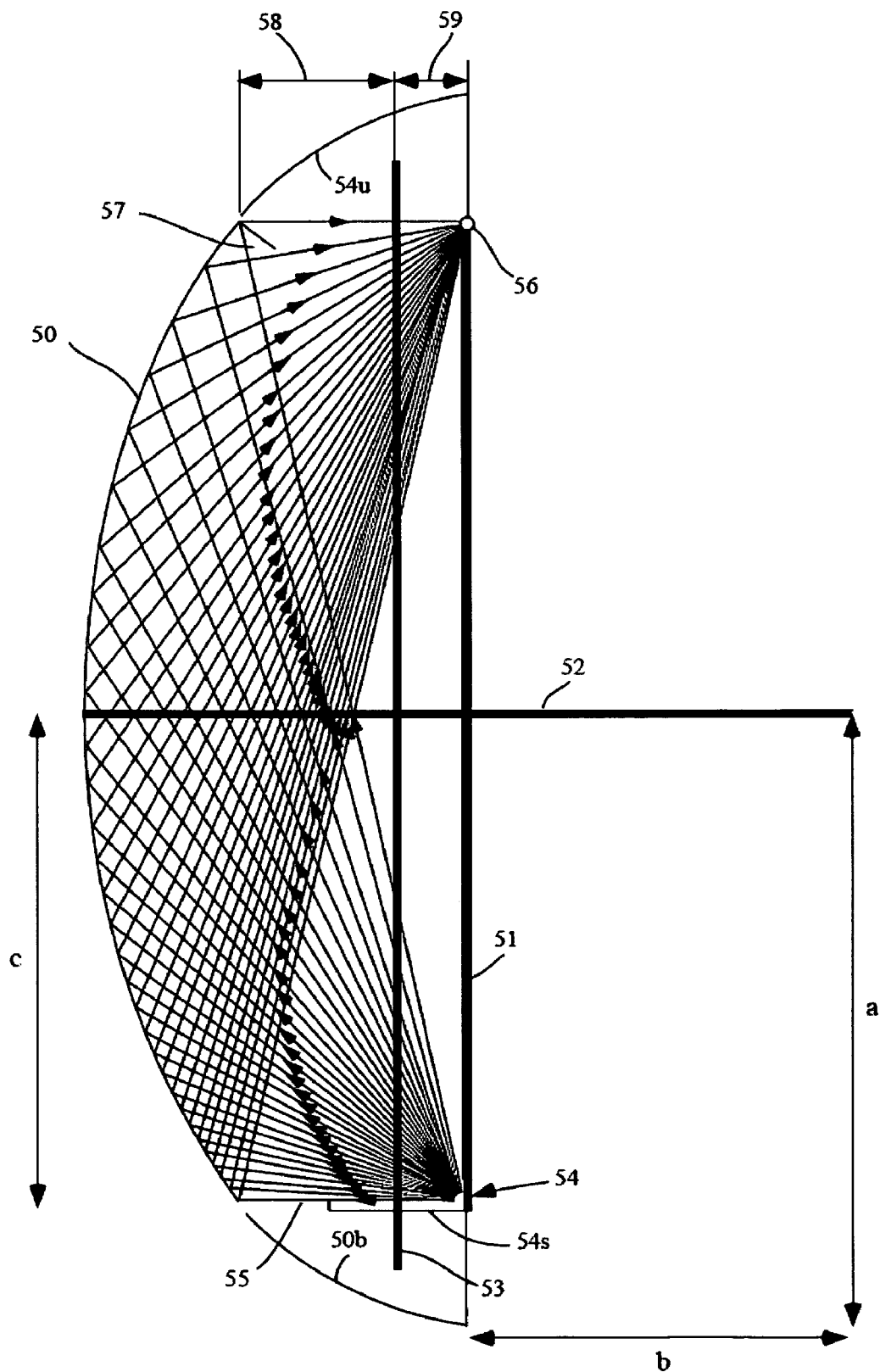
FIG. 5 is a diagram of an off-axis, totally internally reflecting elliptical profile and shows the focal properties of an ellipse.

Referring next to FIG. 5, shown is a diagram of an off-axis, totally internally reflecting elliptical profile, showing the focal properties of an ellipse.

Shown is a reflective ellipse segment 50 having a major axis 51, of semi-length a, and a minor axis 52, of semi-length b. For the sake of illustrating the fuli length of the reflective ellipse, the reflective ellipse segment 50 mathematically continues upwards with short upper segment 54$u$ and short lower segment 50$b$. The reflective ellipse segment 50 is revolved around a central axis 53 to generate a lens shape for the transfer section 11 of FIG. 1. A lower focus 54 and an upper focus 56 are at an equal distance c from the minor axis 52. The lower focus 54 radiates a ray fan 55 that is equivalent to the string method of generating an ellipse. This ray fan reflects off of the reflective ellipse segment 50 to go to the upper focus 56. An uppermost incidence angle 57 has the largest value of all the rays making up the ray fan. The off-axis ellipsoidal surface formed by rotation of the reflective ellipse segment 50 around the axis 53 will totally internally reflect along its entire length if an incidence angle 57, having a value hereinafter designated $\theta_0$, is not less than critical angle $\theta_c = \sin^{-1}(1/n)$.

A radius 58 of the lens is designated as $r_w$ and the radius 59 is designated as $r_s$, the semi-width of a light source, shown as 54$s$ in FIG. 5. The sum of these distances, $R = (r_s + r_w)$, and the edge incidence angle $\theta_0$ determine the shape and size of the reflective ellipse segment 50. The distance between the two foci is 2c, and R is the base of the triangle formed by either the first or last of the rays of the ray fan 55, known as edge rays. From the triangle it can be seen that $$2c = R \tan 2\theta_0$$

The edge slope of the reflective ellipse segment 50 is $\tan \theta_0$, so that differentiation of the ellipse equation yields $$b^2 = \tan \theta_0 R \, a^2/c$$

Using the standard identity for ellipses, $a^2 = b^2 + c^2$, yields:

$$a = c/\sqrt{(1 - 2 \tan \theta_0 / \tan 2\theta_0)}$$

or $$a = \tfrac{1}{2} R \tan 2\theta_0 / \sqrt{(1 - 2 \tan \theta_0 / \tan 2\theta_0)}$$

For polycarbonate this edge-total internal reflectance (TIR) condition gives a relatively tall profile, with aspect ratio $a/R = 5.89$ at $\theta_0 = 39.1°$ for polycarbonate. This creates a problem for a candidate LED with $R = 2.5$ mm, the diameter of reflector cup 21 in FIG. 2. The resultant 14 mm height is twice the focal height of a typical 2" parabolic reflector above its base, worse yet because an ejector section will add even more height.

Figure 6:
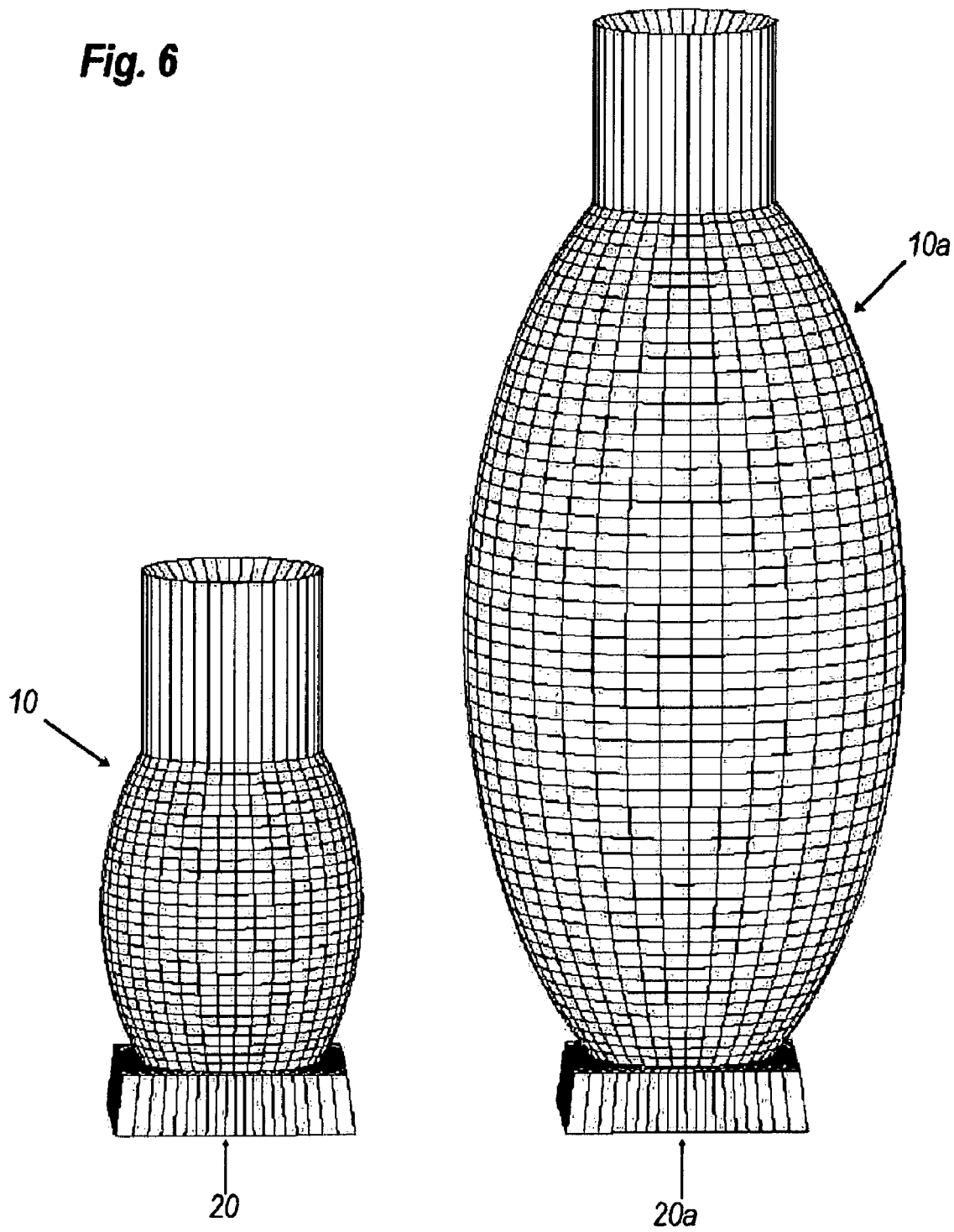
FIG. 6 is a perspective view of two optical devices similar to that of FIG. 1 according to two embodiments of the present invention, the smaller of which shows the reduction in profile achieved by relaxing the TIR condition.

Referring next to FIG. 6, shown is a top perspective view of two optical devices similar to that of FIG. 1 according to two embodiments, the smaller of which shows the reduction in profile achieved by relaxing the TIR condition.

The lens 10 on the LED package 20 is shown as in previous FIGS. 1 through 4, while a full-TIR version lens 10a is shown with a LED package 20a. Moreover, this leakage is usefully forward. Reducing the value of $\theta_0$ enables the height of the lens 10 to be reduced, but edge rays leak out. The total internal reflection condition is not enforced over the entire surface of the transfer section 11, leading to a major reduction in device height at a modest leakage cost of less than 10%, as determined by ray-tracing. If the LED package 20 is Lambertian, not much energy is at the large angles from normal that strike near the bottom of the reflective ellipse segment 50. Monte-Carlo simulations with a Lambertian emitter that fills the bottom of the lens ($r_s = r_w$) will suffer a surprisingly small loss of only 7% for a better than 2:1 height reduction, as shown in FIG. 6.

Figure 7A:
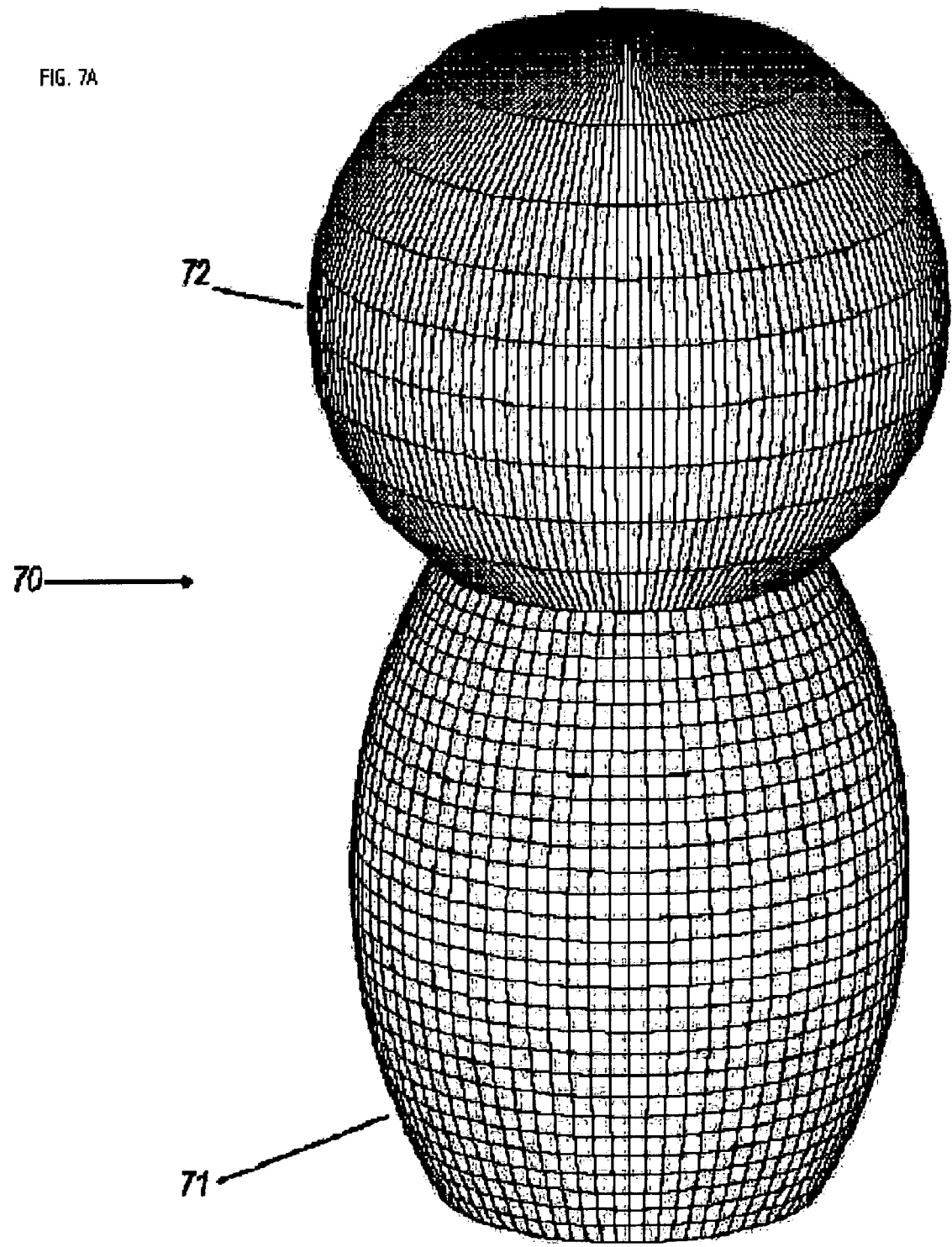
FIG. 7a is a perspective view of an optical device according to an alternative embodiment of the present invention.

Referring next to FIG. 7a, shown is a top perspective view of an optical device according to an alternative embodiment of the present invention. Shown is lens 70 comprised of an off-axis ellipsoidal transfer section 71 and a spherical, diffusive ejector section 72.

The surface of the ejector section 72 has diffusive characteristics, so that each point on the ejector section 72 has a brightness proportional to the light received from the transfer section 71. The advantage of this kind of ejector section is that the multiple wavelengths from a tricolor LED are mixed before they leave the ejector section 72. In the non-diffusive ejector section 12 discussed above, the color mixing may be incomplete, leading to coloration of the output beam of a parabolic reflector, such as that in FIG. 4. The ejector section 72 is larger than the transfer section 71 (i.e., having a larger diameter than a middle diameter of the transfer section 71), so that it has some downward facing surfaces to send light towards the bottom of a parabolic reflector. Such a diffuser also acts to mix the colors of the red, green, and blue source chips within the LED light source, as previously discussed for FIG. 3. Other ejector sections can be used as well, for producing different output patterns.

Figure 7B:
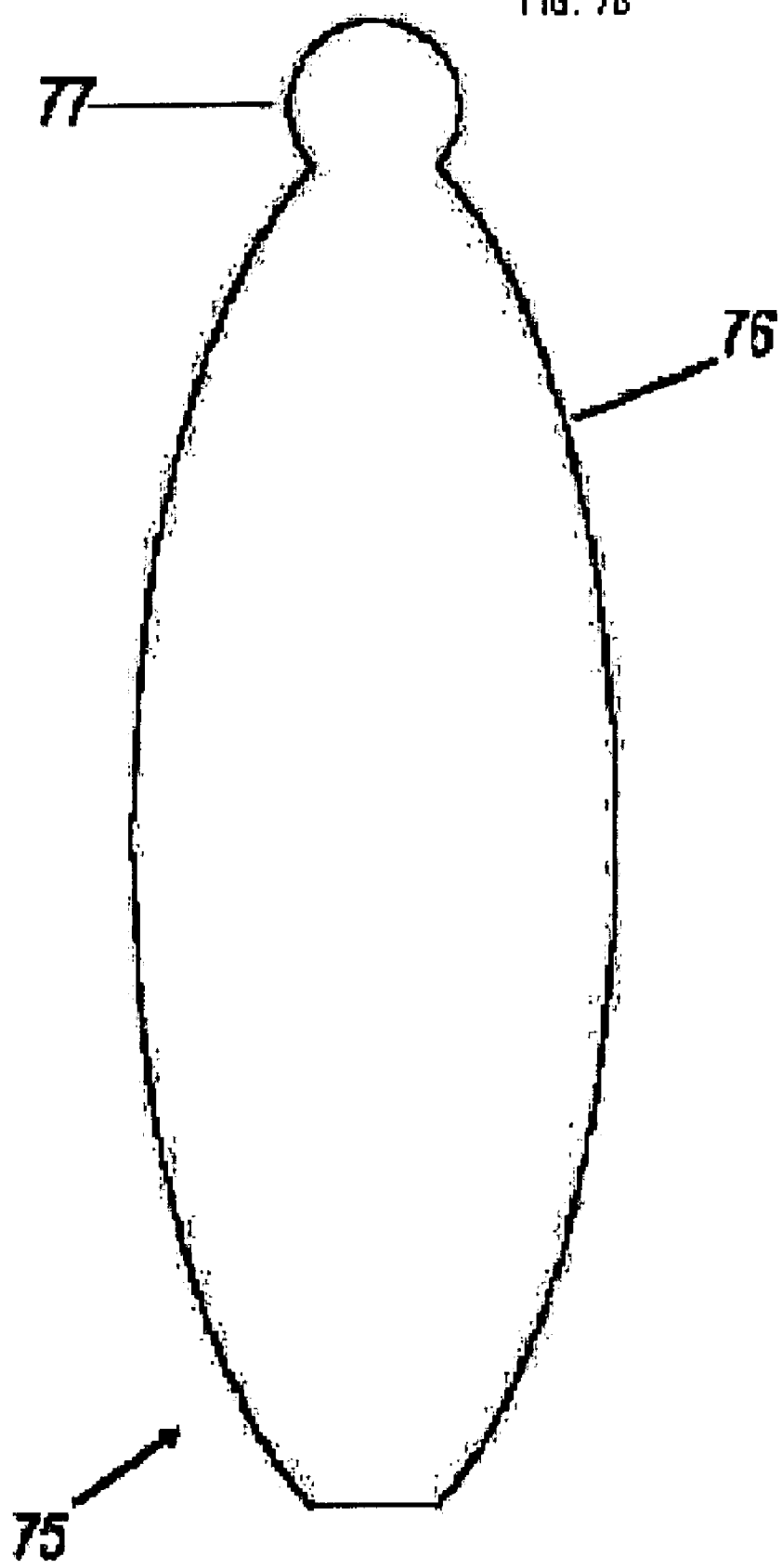
FIG. 7b is a side view of a variant of the device of FIG. 7a according to an embodiment of the present invention.

Referring next to FIG. 7b, shown is a side view of a variant of the device of FIG. 7a according to an embodiment of the present invention.

FIG. 7b shows a variant of the previous ball design. Lens 75 comprises an off-axis ellipsoidal lower section 76 and an upper spherical ejector section 77. Due to the smaller ejector size the variant radiates less in the angles beyond 900° than the previous ball design in FIG. 7a.

Referring next to FIGS. 8a and 8b, shown are side views of cone-topped optical devices according to alternative embodiments of the present invention.

Shown are two embodiments of a lens 80, 85 with conicoid ejectors. Conicoids include curvilinear as well as the straight-line cones. FIG. 8a shows a lens 80 comprising a lower transfer section 81 and a conicoid ejector 82 starting at a point on along the top of the transfer section 81 where the diameter of the base of the conicoid ejector 82 is smaller than that of the transfer section 81, making an abrupt transition from the transfer section 81 to the ejector 82. FIG. 8b shows lens 85 comprising lower transfer section 86 and a larger conicoid ejector 87 than that of FIG. 8A. flere the ejector 87 starts at a point on along the top of the transfer section 86 where the diameter of the base of the conicoid ejector 87 is the same as that of the transfer section 86, making a smooth transition from the transfer section 86 to the ejector 87. Such conicoid ejectors can be used to send less light forward and more to the side, such as for the parabolic reflector of FIG. 4.

Referring next to FIGS. 9a to 9d, shown are side views of other optical devices according to alternative embodiments.

Figure 9A:
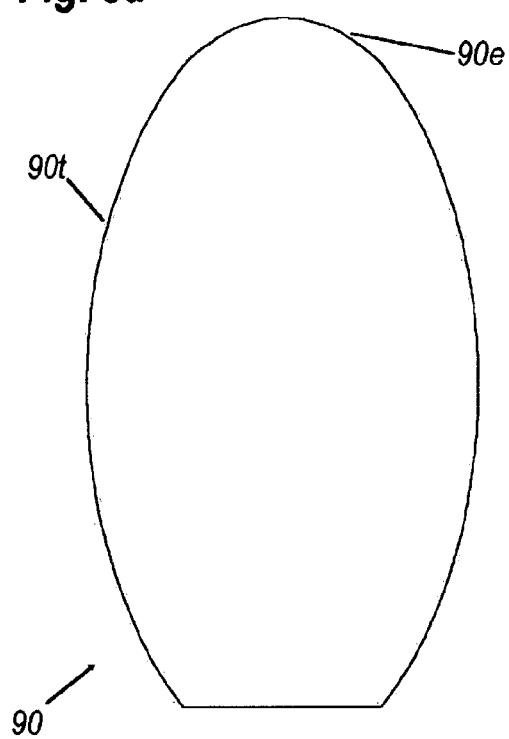
FIGS. 9a to 9d are side views of other optical devices according to alternative embodiments of the present invention.
Figure 9B:
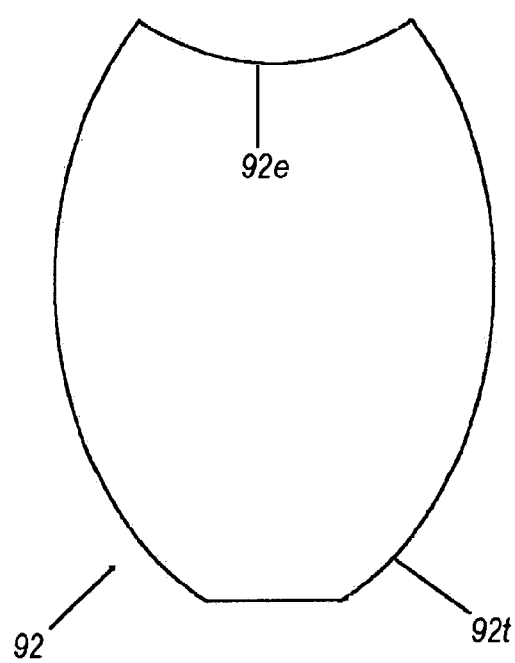
Figure 9C:
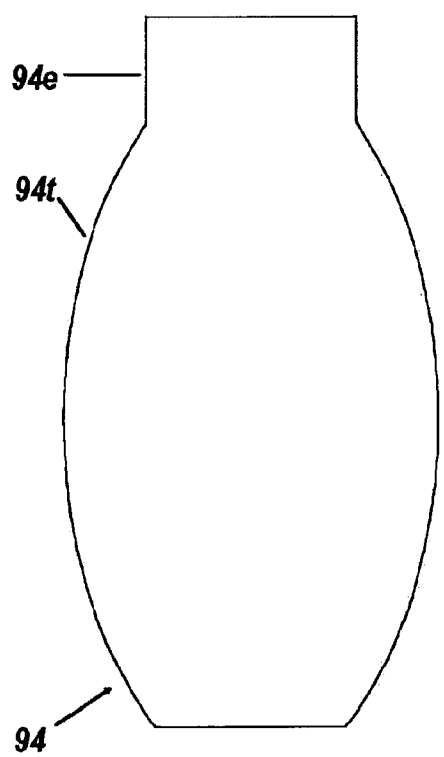
Figure 9D:
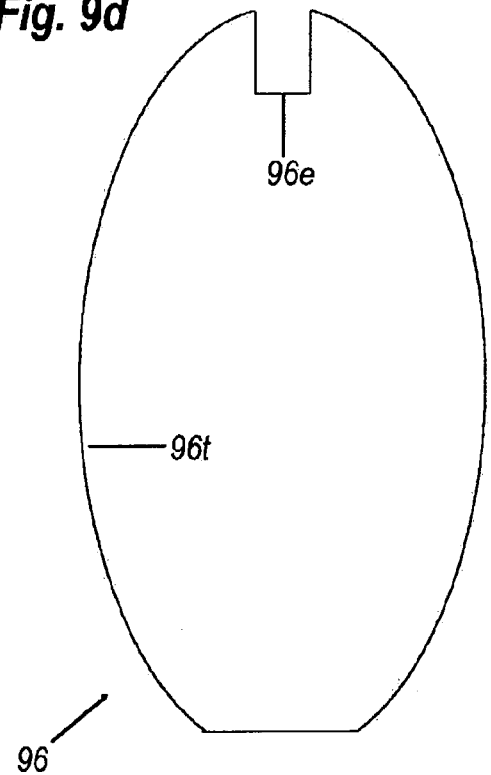

FIG. 9a shows a lens 90 comprising a lower transfer section 90t and an ellipsoidal ejector 90e, tending to produce a relatively narrow forward beam and thus needing no parabolic mirror. FIG. 9b shows lens 92 comprising lower transfer section 92t and indented ejector 92e with a spherical depression on top of the ejector 92e. FIG. 9c shows lens 94 with transfer section 94t and cylindrical ejector 94e. FIG. 9d depicts lens 96 comprising transfer section 96t and internal diffuse cylindrical ejector 96e.

Figure 9E:
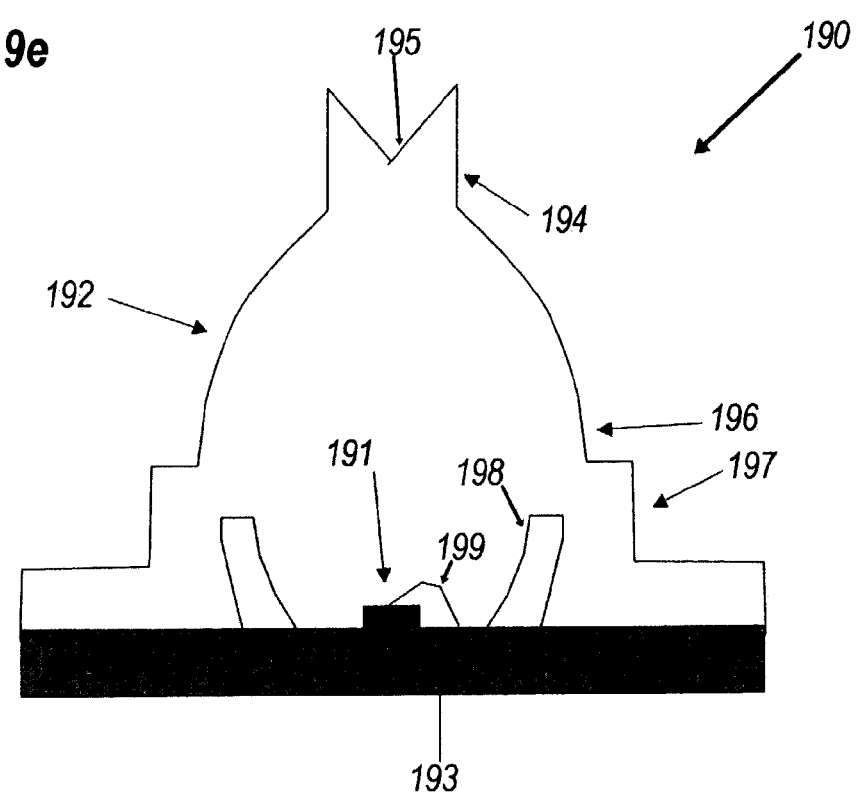
FIG. 9e is a side cross-sectional view of an LED package optical device according to an alternative embodiment of the present invention.

Referring next to FIG. 9e, shown is a side cross-sectional view of an LED package optical device according to an alternative embodiment of the present invention.

Regarding the use of the present invention with LEDs, an alternative embodiment is illustrated in FIG. 9e. Shown is LED package 190 having source chip 191, transparent dielectric 192, lead frame 193, ejector section 194, conical indentation 195, upper transfer section 196, optically inactive base 197, reflector cup 198 and lead wire 199.

In order to facilitate manufacturing integration, this preferred embodiment can be produced integrally as a monolithic LED package comprising the device of FIG. 3. LED package 190 has source chip 191 immersed in transparent dielectric 192 and mounted on lead frame 193. The lead wire 199 from the source chip 191 is operably connected to the lead frame 193. Ejector section 194 has conical indentation 195 and is atop upper transfer section 196. Optically inactive base 197, like all other near-vertical surfaces in FIG. 9e, has a positive mold release. Reflector cup 198 acts as a lower transfer section. Upper transfer 196 operates via total internal reflection. Both transfer sections, upper 196 and lower 198, have common foci on chip 191 and on the outer edge of ejector section 194.

Turning to embodiments that substitute for tubular fluorescent lamps, there are two defining novelties. First is a serial joining of a multiplicity of successive transfer sections with intercalated ejector sections. Second is the substitution of ejector sections by making the surfaces of these sections diffusely emissive themselves.

When multiple transfer sections are joined into a single lens body, light injected at one end will propagate all the way to the other end.

Figure 10:
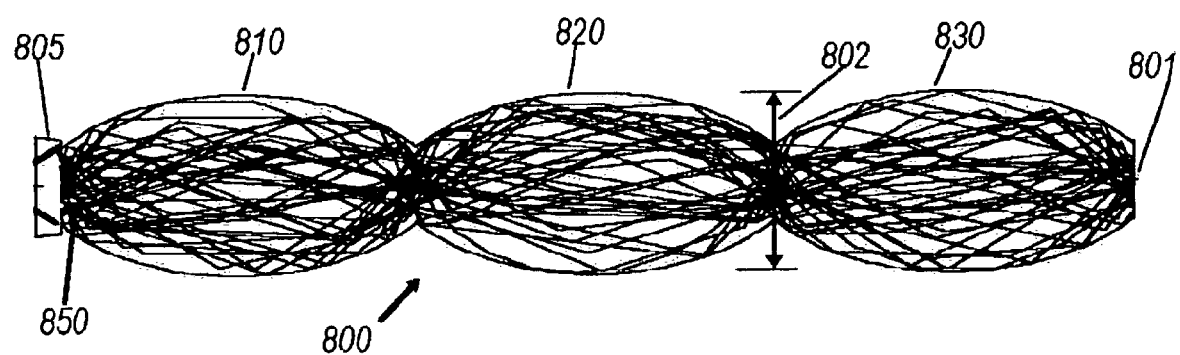
FIG. 10 is a side view of an optical device with multiple transfer sections and a depiction of light propagating through the device according to an embodiment of the present invention that substitutes for tubular fluorescent lamps.

Referring next to FIG. 10, shown is a side view of an optical device with multiple transfer sections and a depiction of light propagating through the device according to an embodiment of the present invention that substitutes for tubular fluorescent lamps.

Shown is a cross-section of a dielectric body 800, comprising three identical off-axis ellipsoids 810, 820, and 830. A light source 805 emits rays 850 that proceed rightward to an end-plane 801. The above mentioned TIR condition is fulfilled by these off-axis elliptical profiles, so that they have the proportions of the taller section 10*a* of FIG. 6. Thus, all rays 850 arrive via numerous internal reflections to the end-plane 801. The only reason for having multiple such sections would be a limit on overall diameter 802. For example, duplicating the proportions of a small, battery-powered fluorescent lamp could involve more than three such ellipsoidal sections. There is preferably an LED at both ends of such a lens.

There are two embodiments for duplicating the emission of a fluorescent lamp. The first is a succession of transfer sections with intercalated ejector sections. These ejectors will be functionally different from those of the flashlight-bulb substitutes previously discussed, for two reasons. First, light will be coming from both directions into the ejector section, because there is an LED light-source at each end. Second, the angular output range is only lateral, without the forward emission required of the ejector section of a flashlight-bulb substitute, as previously discussed.

The exit plane of a transfer section can be considered as a source in itself, with a particular spatio-angular distribution of outward-going light. Each of the three colors from the source has its separate distribution, originally emanating from one of the LED chips 22, 23, or 24 of FIG. 2, as well as its diffuse reflection from conical sidewall 21. The off-axis ellipsoidal shape of the transfer section acts as a non-imaging optical device, in that the original spatio-angular distribution at its entrance is strongly scrambled at its exit.

Figure 11:
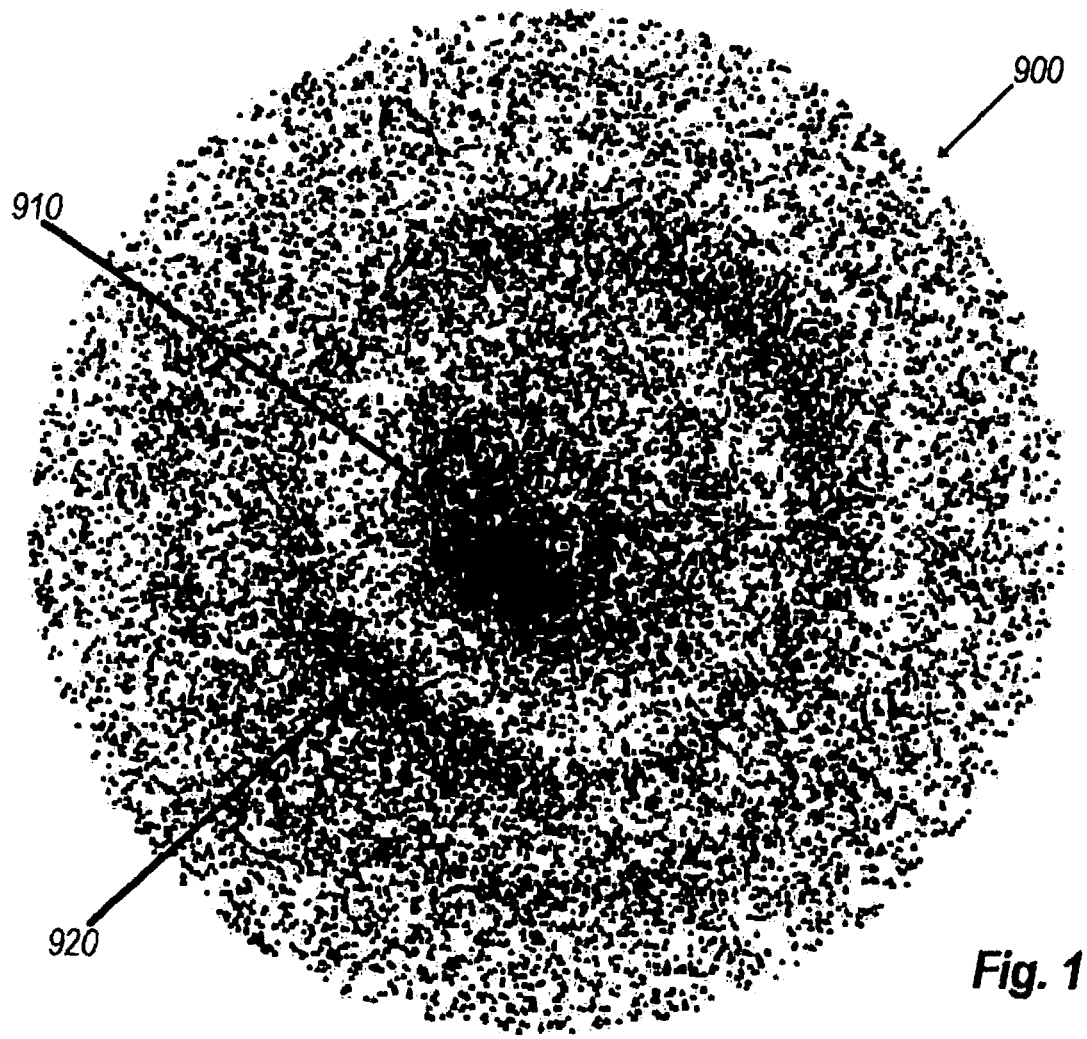
FIG. 11 is a spot diagram depicting ray density at exit plane 14 of the transfer section of FIG. 2.

Referring next to FIG. 11, shown is a spot diagram depicting ray density at exit plane 14 of the transfer section of FIG. 2. These rays are leaving transfer-section 11 after being emitted by one of the colored chips and being totally internally reflected therein. Shown is distribution 900 of 20000 rays traced from one chip, with cluster 910 its blurry image, and annulus 920 corresponding to the slanting conical sidewall of the reflector cup 21, but most of the spots are distributed at random, due to multiple Internal reflections. These more randomized, multiply reflected rays have a Lambertian angular distribution. The spatio-angular distribution of this light is important to ejector design, because it determines how much light intercepts the ejector.

Figure 12:
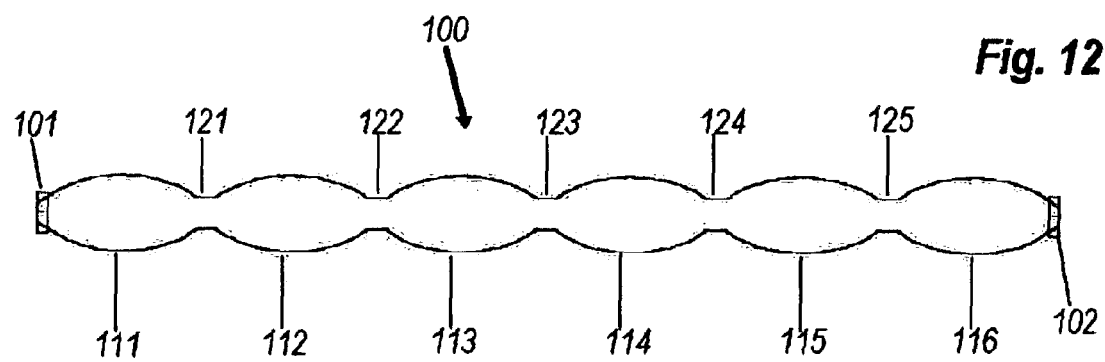
FIG. 12 is a side view of a multi-section optical device according to an embodiment of the present invention with an LED at each end, acting as a substitute for fluorescent lamps.

Referring next to FIG. 12, shown is a side view of a multi-section optical device according to an embodiment of the present invention with an LED at each end, acting as a substitute for fluorescent lamps.

FIG. 12 illustrates a preferred embodiment exemplified by luminaire 100 with LED packages 101 and 102 optically joined to each end of a plastic body comprising off-axis ellipsoidal transfer sections 111 through 116 and intercalated diffuse ejector sections 121 through 125. Their relative length determines how much light they intercept. Their diffuse transmittance is produced by wavelength-scale roughness, the amplitude of which determines how much of this light is scattered.

Figure 13:
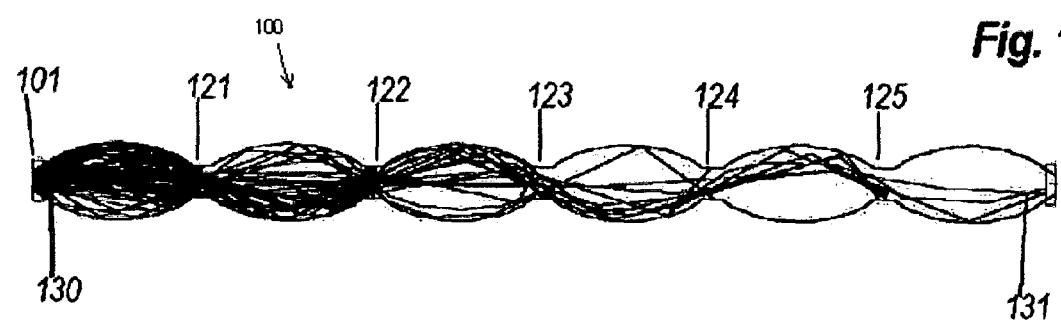
FIG. 13 is FIG. 12 with a depiction of rays coming from one source.

Referring next to FIG. 13, shown is the device of FIG. 12 with a depiction of rays coming from one source.

Shown is the luminaire 100 with the LED package 101 with single-chip emission represented by rays 130, seen to be propagating rightwards via total internal reflection. At each of successive cylindrical ejector sections 121 through 125, about a third of the light entering is intercepted, so tat the small number of remnant rays 131 represent only a few percent of all the light from the LED package 101. It is not shown what happens to the light intercepted by the ejector sections.

Figure 14:
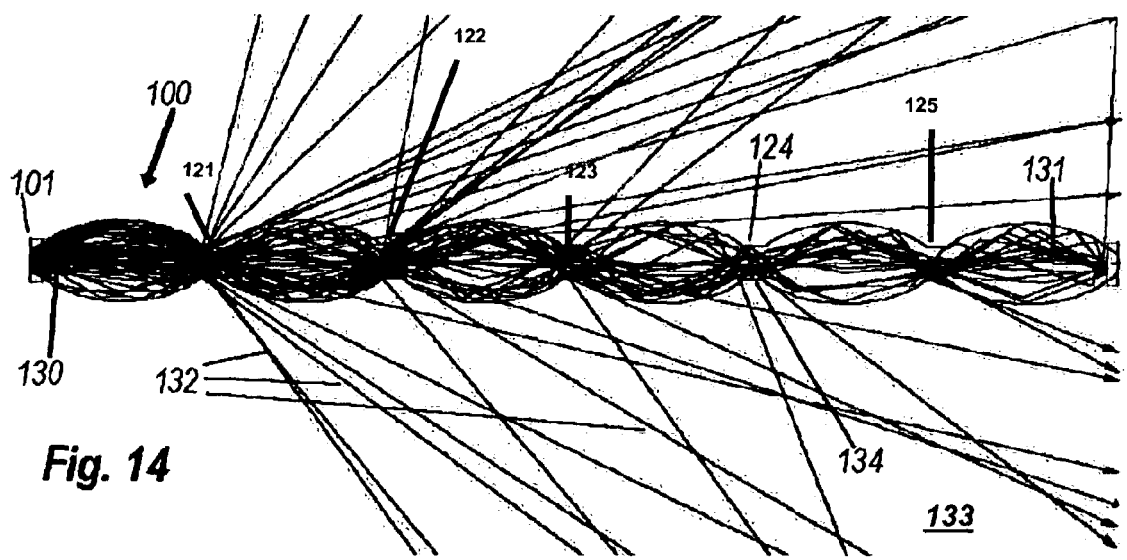
FIG. 14 is FIG. 12 with a depiction of rays scattered from one ray being totally internally reflected.

Referring next to FIG. 14, shown is the device of FIG. 12 with a depiction of rays scattered from one ray being totally internally reflected.

Shown is the luminaire 100 with the LED package 101 and rays 130 emitted therefrom. The rays 132 have refracted into outside air 133. Rays 134 are shown being internally reflected by an ejector section 124. Such rays remain within the body of luminaire 100, so that there are many more rays 131 remaining at the opposite end of luminaire 100 from the LED package 101. A rough surface on the ejector sections 121, 122, 123, 124, 125 will cause the ejector sections to become diffuse scatterers of light impinging on them. A proper distribution of roughness (determined as described infra) will see to it that there are only the small amount of remnant rays 131 shown in FIG. 14.

Exactly duplicating the luminous surface-emission of a fluorescent lamp requires firstly that the entire surface of the device seem to be glowing, that is, it all is an ejector. Secondly, there are is an alternative to the multiple-ellipsoid approach of FIG. 13 and FIG. 14, namely the cylindrical shape of fluorescent lamps themselves.

Figure 15:
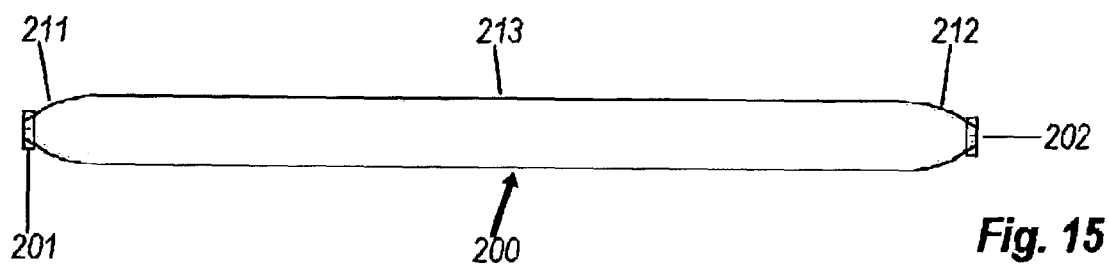
FIG. 15 is a side view of an optical device according to an embodiment of the present invention with an LED at each end, acting as a substitute for fluorescent lamps.

Referring next to FIG. 15, shown is a side view of an optical device according to an embodiment with an LED at each end, acting as a substitute for fluorescent lamps.

Shown is luminaire 200 with LED packages 201 and 202 at each end. The expander sections 211 and 212 channel light from the LED packages 201 and 202 into cylindrical section 213, which will act as the ejector section via a phenomenon that ordinarily is a source of optical losses in devices utilizing total internal reflection; namely, scattering by sub-wavelength roughness. Plastic fiber optic devices are limited in length by such scattering to much shorter rims than with glass. The embodiment depicted in FIG. 15 incorporates this phenomenon in a deliberately calibrated manner so as to produce a desired surface emission. This emission, however, is inward from the surface section 213, not outwards as in a fluorescent lamp.

Figure 16:
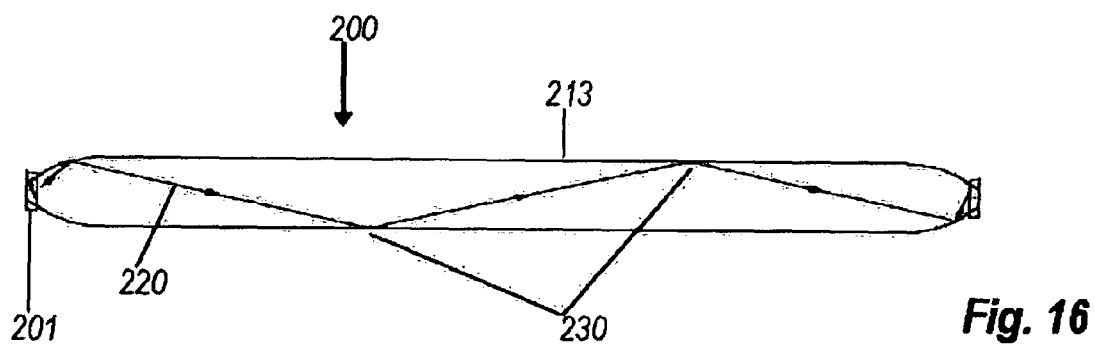
FIG. 16 is a side view the optical device of FIG. 15 with an exemplary ray shown propagating to the right.

Referring next to FIG. 16, shown is the optical device of FIG. 15 with an exemplary ray shown propagating to the right.

The same lens shape as in FIG. 15 is shown as luminaire 200 with LED package 201 and tubular ejector section 213. Exemplary ray 220 is shown propagating to the right, with total internal reflection at points 230.

Reference is hereby made to 'Loss mechanisms in optical light pipes' by Remillard, Everson, & Weber, *Applied Optics*, Vol. 31, #34, pp 7232–7241, December 1992, the entirety of which is incorporated herein. Specifically therein, equation (8) shows how internal reflectance $R_0$ (TIR means $R_0=1$) is reduced to reflectance R according to rms surface roughness σ, when the roughness is described by Gaussian statistics:

$$R_{spec} = R_0 \exp[-(2k\perp \sigma)^2]$$

where $k\perp = 2\pi n \cos \theta/\text{wavelength}$ is the wave number normal to the surface, for incidence angle $\theta > \theta_c$, within a medium of refractive index n. For 0.5 micrometer wavelength (500 nm) and n=1.58 ($\theta_c = \sin^{-1}(1/n) = 39.3°$, so $\cos \theta < 0 < 0.77$ and $k\perp = 15,288/\text{mm} = 15.3/\mu m$

TABLE I

| σ(x), nm | $R_{spec}$ (x) | $R_{diff}$ (x) |
|---|---|---|
| 1 | 0.999 | 0.001 |
| 2 | 0.996 | 0.004 |
| 5 | 0.976 | 0.024 |
| 10 | 0.911 | 0.089 |
| 15 | 0.810 | 0.190 |
| 20 | 0.688 | 0.312 |
| 25 | 0.558 | 0.442 |
| 30 | 0.431 | 0.569 |
| 35 | 0.318 | 0.682 |
| 40 | 0.224 | 0.776 |
| 45 | 0.151 | 0.849 |
| 50 | 0.097 | 0.903 |
| 75 | 0.005 | 0.995 |

The luminance B(x) of scattered radiation is the product of diffuse reflectance $R_{diff}(x) = 1 - R_{spec}(x)$ and the illuminance I(x) of impinging light, and thus it grows rapidly with roughness σ. By varying the roughness at different distances x along the ejector section, graded amounts of scattering can be produced, so as to attain approximately uniform brightness B(x). Note that the higher scattering levels are more wavelength-sensitive and would be less preferred in applications requiring color mixing.

The angular pattern of emission by this controlled sub-wavelength roughness depends upon the structure of its sub-wavelength spatial correlation function C(x, Δx), which measures the extent to which the particular random roughness profile at x resembles the profile at small distance Δx away. Completely uncorrelated roughness results in the even glow of Lambertian emission, while spatial correlations at the same level of roughness will lead to angularly periodic directional variation in luminance, visible as undesirable non-uniformities in brightness.

The lowest (1–5 nm) amounts of roughness listed above, however, are more typical of residual roughness from the best diamond turning anyway. The intermediate levels, in the range $0.8 > R_{diff} > 0.2$, are preferred in this invention, although complete scattering ($R_{diff} \sim 1$) might be called for near the very center of an ejector-tube's length.

The significance of sub-wavelength roughness for total internal reflection is that at the scale of this roughness all light is coherent and thus subject to diffraction, which in turn leads to non-specular reflection via phase disturbances of the reflected light. Non-specular reflection is another name for scattering, but it is important to note than none of this scattering is out of the dielectric body, so none passes through the surface into the surrounding air. Roughness only does this when it is near the wavelength scale, as in the case of the above-mentioned holographic diffuser. When roughness is at 1% of the wavelength, as in the case of this preferred embodiment, all scattering is reflective. Furthermore, this scattering is intended to be inflicted on totally internally reflected light guided within a cylinder. Thus it is not akin to holographic diffusers, which operate on transmitted light. Instead, sub-wavelength roughness scatters a fraction of reflected light, whether it is a Fresnel reflection at a refractive interface or totally internally reflected light.

From the surface of the luminaire 200, roughness-scattered light is reflected back into the body of the ejector section 213, but in all directions, not just along the direction of specular reflection. Some of this scattered light will subsequently have incidence angles from the local surface normal that are less than the critical angle, and thus will exit the device when next encountering the side opposite its scattering point. The internal origin of this scattered light will be visible upon scrutiny of the lens, when Inspection discloses that the light comes from inside. Sub-wavelength roughness does, not affect the specular transmittance of light, so that light exits the lens governed only by Snell's law, unlike the previousiy discussed holographic diffuser, which imparts additional deflection to that of refraction alone. Unlike the wavelength-scale roughness of holographic diffusers, the sub-wavelength roughness utilized by the present invention has no effect upon light refracted through it—only its Fresnel reflection is scattered.

Figure 17:
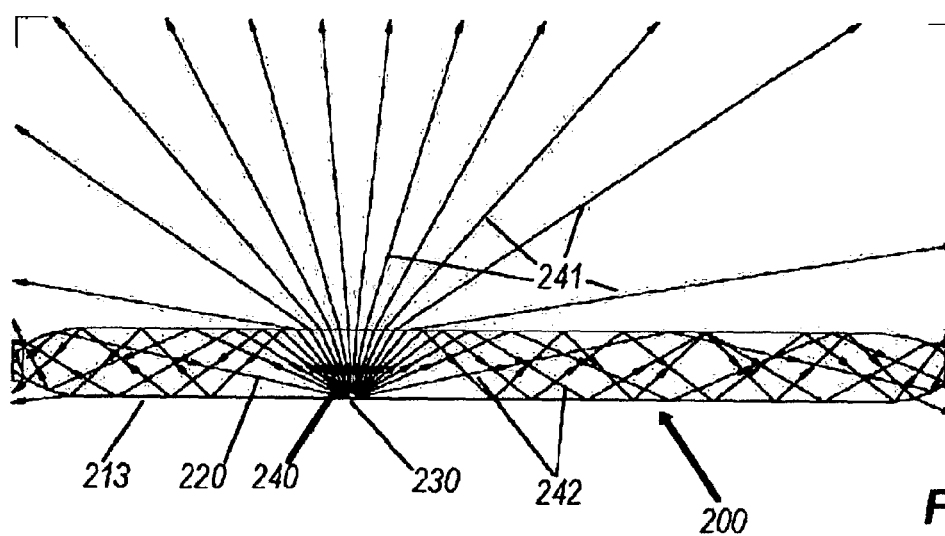
FIG. 17 is a side view of the optical device of FIG. 15 with sub-wavelength surface roughness and exemplary rays shown propagating through the device.

Referring next to FIG. 17, shown is the optical device of FIG. 15 with sub-wavelength surface roughness and exemplary rays shown propagating through the device.

Shown is the same luminaire 200 with tubular ejector section 213, now with sub-wavelength surface roughness. Thus ray 220 from LED package 201 of FIG. 16 gives rise to hemispherical ray-fan 240 emanating from TIR point 230. Rays 241 are transmitted out of surface 213 into the air. Rays 242 stay inside lens 213 because they are trapped by total internal reflection. Each time such a ray is internally reflected, some of its flux is scattered in turn.

The cylindrical shape of the ejector 213 acts as a lens to magnify the interior surface opposite the viewer. Approximately 4-power for such plastics as acrylic or polycarbonate, this magnification tends to give salience to scratches and other surface flaws, including any non-uniformities in the sub-wavelength surface roughness. Such non-uniformities in surface roughness are made visible by the non-uniformities they cause in perceived brightness. This cylindrical magnification means that only a small portion, $1/4/\pi = 8\%$, of the glowing perimeter is actually visible from any particular vantage point.

Figure 18:
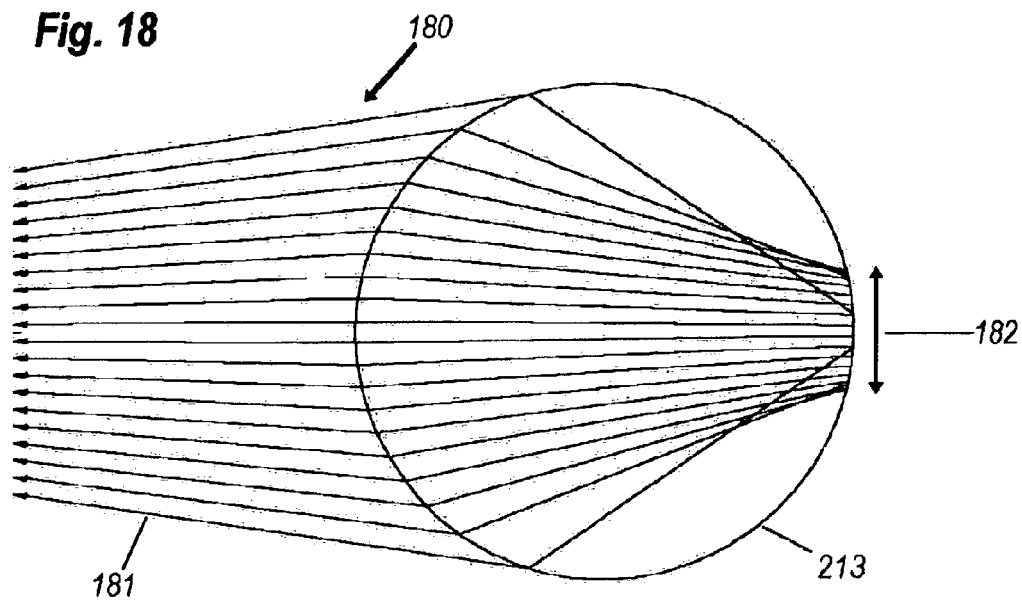
FIG. 18 is a front cross-sectional view of the cylindrical ejector section of FIG. 17 depicting the sphere-projection method of calculating view factors.

Referring next to FIG. 18, shown is a front cross-sectional view of the cylindrical ejector section 213 of FIG. 17 depicting the sphere-projection method of calculating view factors.

Meridional ray fan 180 represents light originating by scattering from the inside surface of the ejector 213. It is refracted out the opposite side of the ejector 213 and propagates to meet at a viewpoint to the left, not shown. From that viewpoint, zone 182 seems magnified to fill the entire image of the ejector section 213. Edge ray 181 appears to originate from the edge of the ejector section 213, although it actually comes from the center of zone 182. The large incidence angle of this edge ray reduces its transmittance, giving a slight edge-dimming to the glowing appearance of the ejector section 213. The proper distribution of roughness σ(x), for location x along the tube, will give fairly uniform brightness to the ejector section.

Calculating the proper roughness distribution σ(x) falls in the category of inverse problems. The cylindrical geometry of the ejector section 213 lends itself to a mathematical analysis based on thin rings of interior surface of the tube. The aspect ratio of tube length to diameter, equal to 13:1 in FIG. 15, will play a role as well. The guided light from the expander section comes down the tube and, at each length coordinate x, some of it is scattered by roughness σ(x), while the remainder is specularly reflected, with reflectivity R given in the table above. Only 40% of this roughness-scattered light refracts out the other side of the tube, while the remainder adds to the guided light, helping to make brightness more uniform.

Once emitted into the body of the ejector section, roughness-scattered light is subject to the additional effects of total internal reflection.

Figure 19:
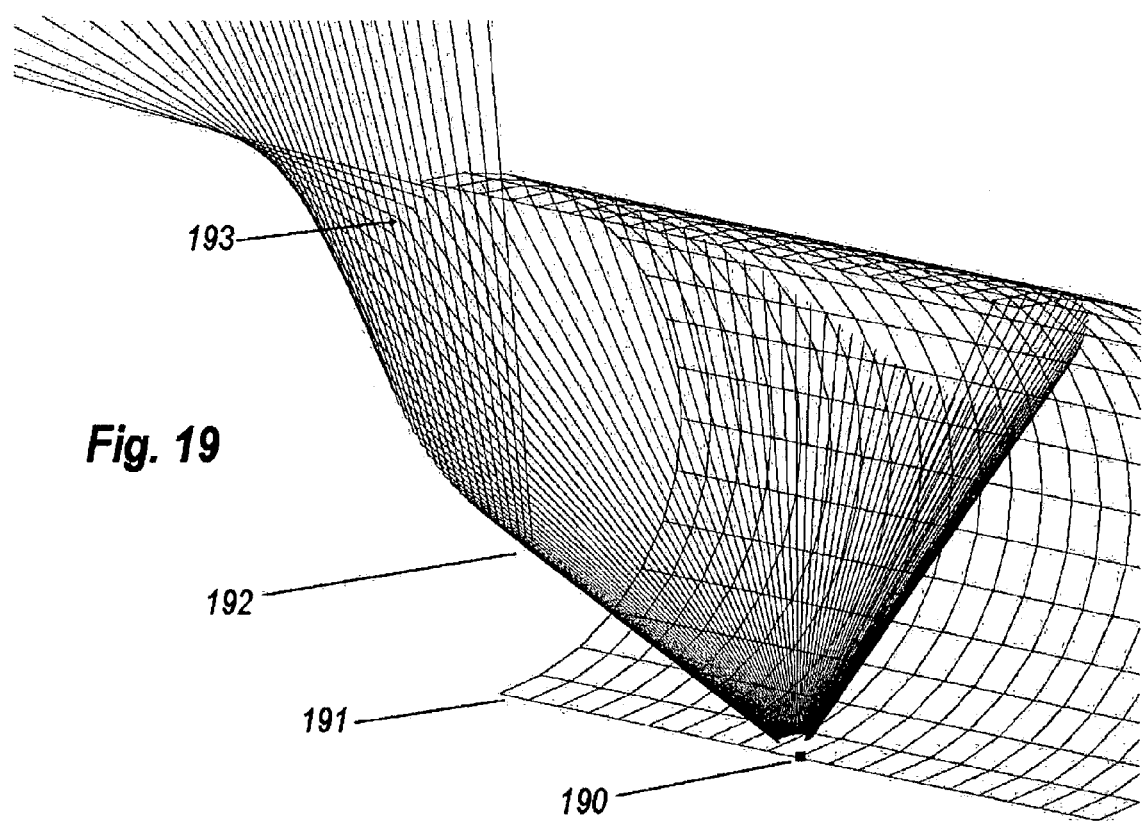
FIG. 19 is a partial perspective cut-away view of the cylindrical ejector section of FIG. 17 depicting rays emitted at the critical angle with the surface normal of the interior of the cylinder and intersecting the cylinder at the same critical angle.

Referring next to FIG. 19, shown is a partial perspective cut-away view of the cylindrical ejector section 213 of FIG. 17 depicting rays emitted at the critical angle with the surface normal of the interior of the cylinder and intersecting the cylinder at the same critical angle.

FIG. 19 shows scattering point 190 on the interior surface of cylinder 191, only half of which is shown, for clarity. Point 190 acts as a source for ray-cone 192, emitting at angle $\theta_c$ from the local surface normal, with three quadrants of it shown, and one quadrant being refracted into external air. Exemplary ray 193 is shown being refracted to nearly 90° incidence angle as it passes into the external air. Uncorrelated surface roughness causes scattered light to be Lambertian, so that the fraction of ejected light is that emitted at less than the angle $\theta_c$ from the normal, which will be $\sin^2\theta_c$. Thus the escape fraction of the scattered light for n=1.59 will be $\sin^2\theta_c = 1/n^2 = 39.6\%$ Referring next to FIG. 20a, shown is a side perspective view of the device of FIG. 15 showing the coordinate system for calculating optimal roughness distribution.

Figure 20A:
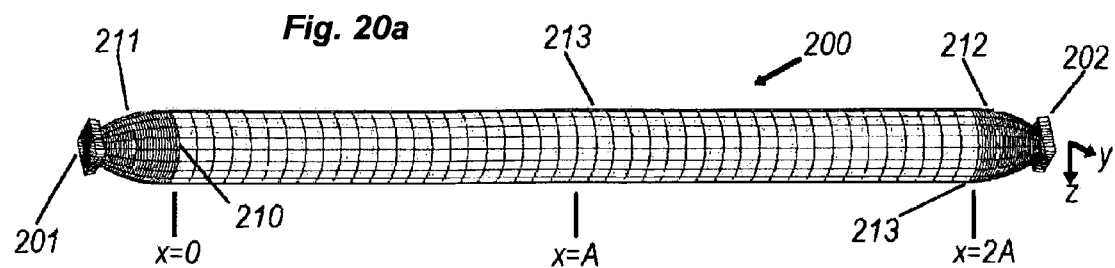
FIG. 20a is a side perspective view of the device of FIG. 15 showing the coordinate system for calculating optimal roughness distribution.

FIG. 20a shows a perspective version of FIG. 15, with the luminaire 200 comprising the LED packages 201 and 202, the expander sections 211 end 212, and the cylindrical ejector section 213. Deploying the origin x=0 at the ejector endpoint and assuming unit radius r=1, gives problem domain 0<x<A, for aspect ratio A=L/r, given ejector length L.

Figure 20B:
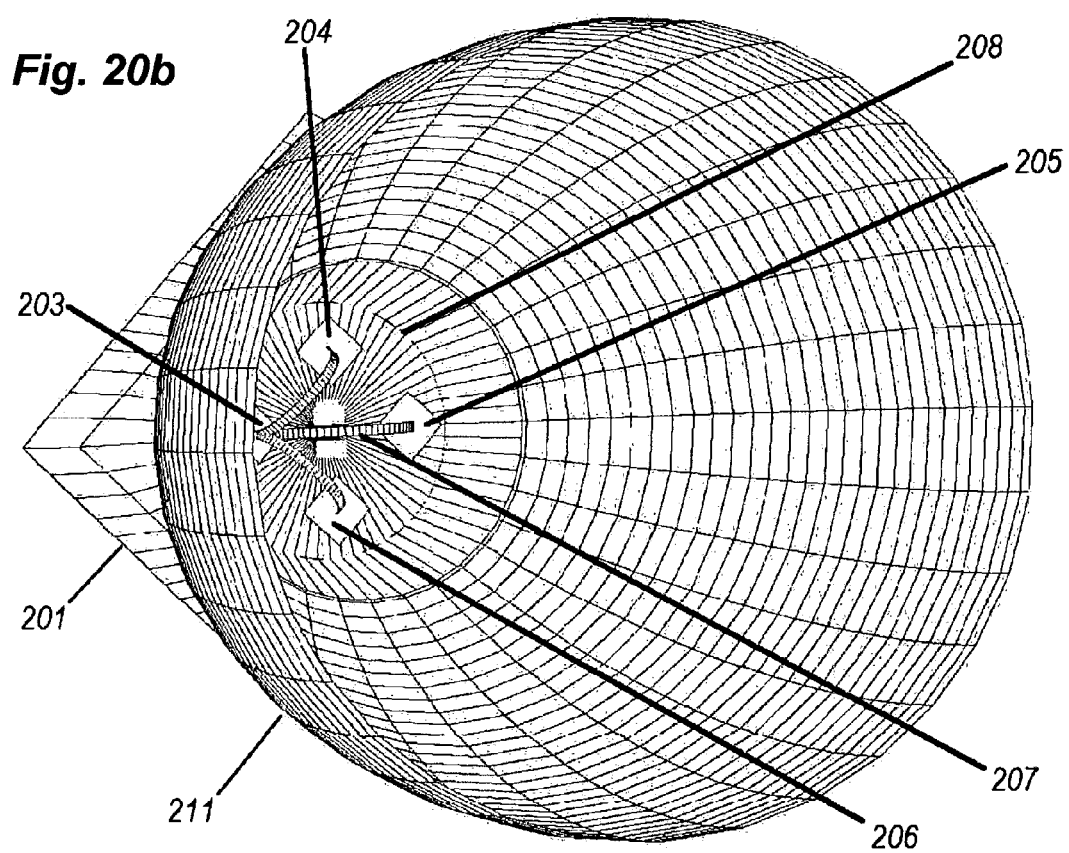
FIG. 20b is a top perspective close up view of an expander section according to an embodiment the present invention.

Referring next to FIG. 20b, shown is a top perspective close up view of the expander section 211 according to an embodiment the present invention.

FIG. 20b is a view inside the expander section 211, atop LED package 201. Within the LED package 201 are differently colored LED chips 204, 205, and 206. Common electrode 203 is connected to the chips by wires 207. White cup-shaped diffuse reflector 208 is filled with a protective transparent epoxy (not shown).

Figure 20C:
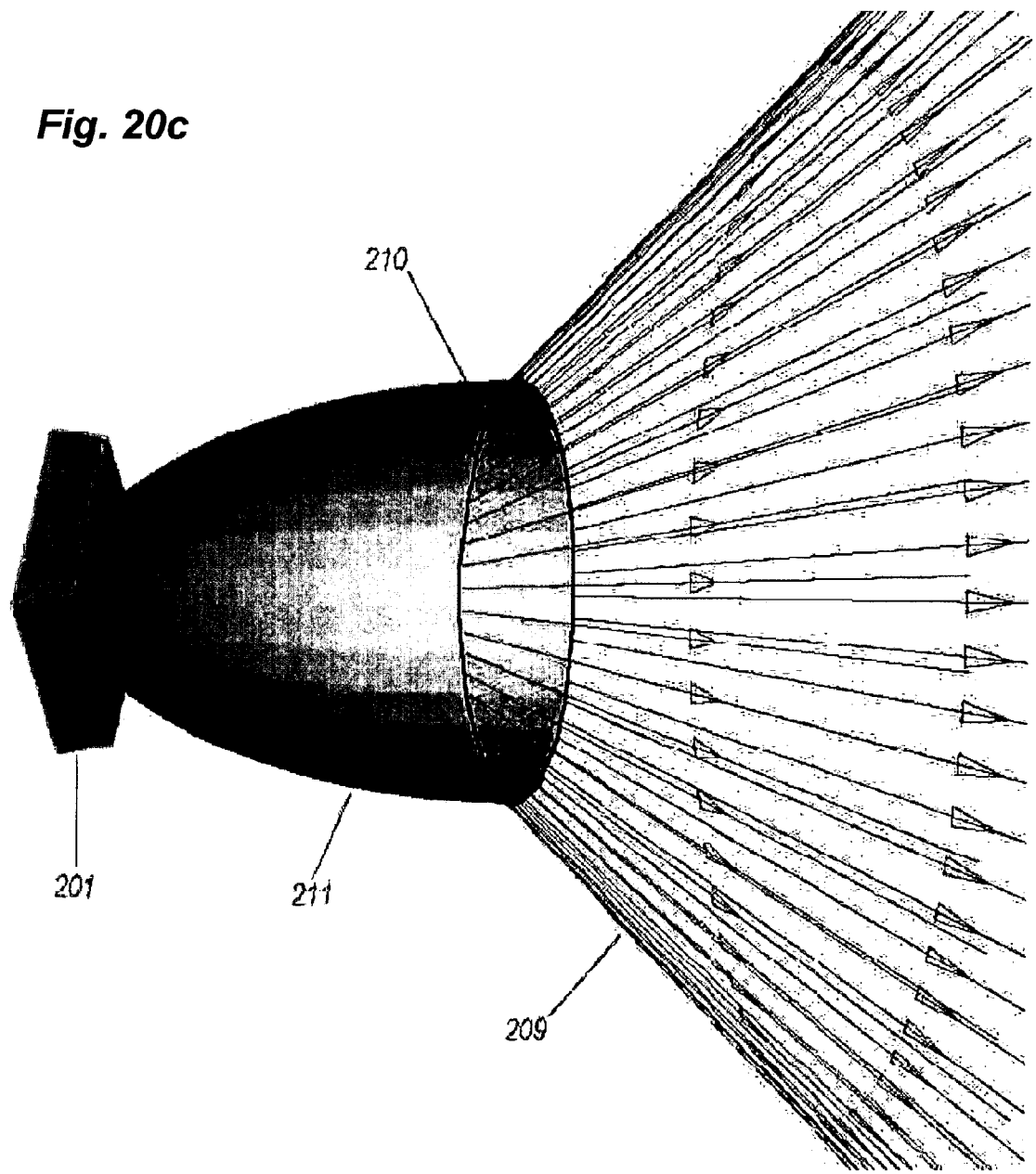
FIG. 20c is a side perspective view of the expander section of FIG. 20b showing edge rays of the expander section.

Referring next to FIG. 20c, shown is a side perspective view of the expander section 211 of FIG. 20b showing edge rays of the expander section 211.

FIG. 20c depicts the expander section 211 and LED package 201. Circular edge 210 delimits output rays to the angle of ray-fan 209. The area enclosed by circle 210 acts as a spatially uniform source in a simplified analysis of ejector performance. Section 211 is specifically shaped to restrict its output angle, $\theta < \theta_g$. Edge rays 209 shine from the perimeter 210 of section 211 and mark the limit of the light pattern to less than angle $\theta_g$.

The view-factor approach is the basis for calculating interior illuminance inside the ejector 213 of FIG. 20a. The illumination I(x) at coordinate x along the interior surface of the ejector section is a result of luminance adding up over a hemispherical field of view.

Figure 20D:
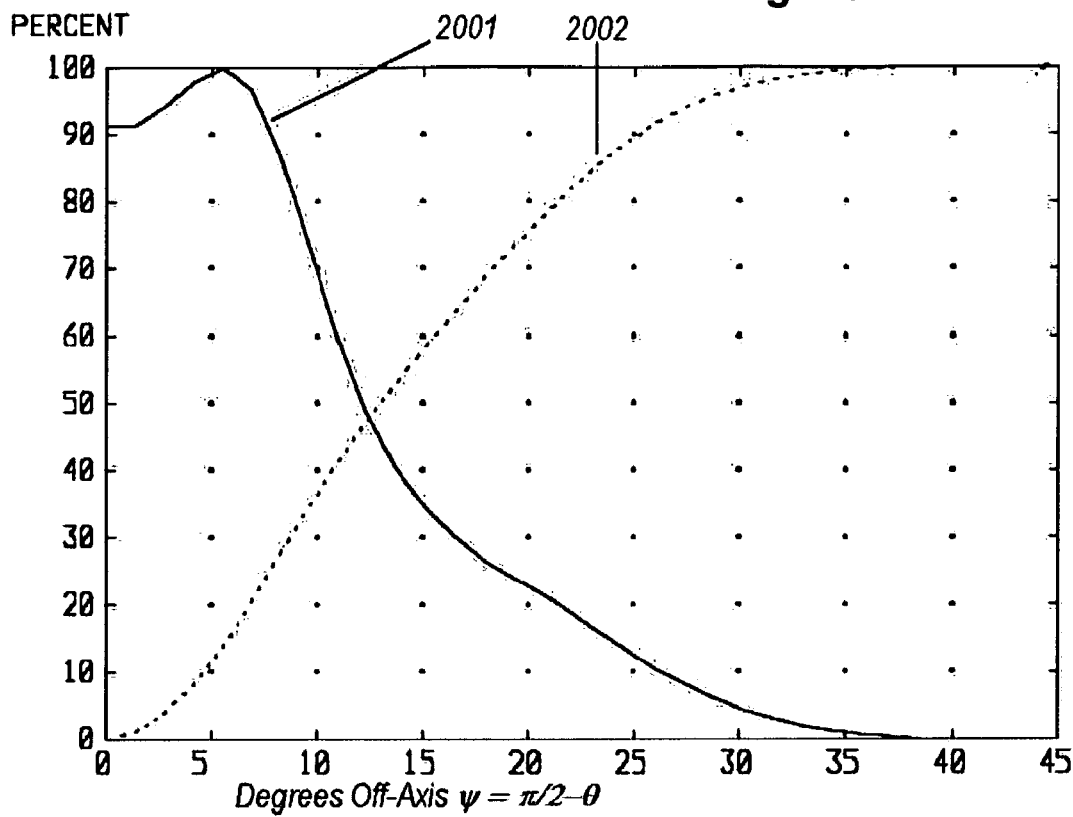
FIG. 20d is a graph showing the angular variation of spatially averaged luminance of expander section output.

Referring next to FIG. 20d, shown is a graph depicting the angular variation of spatially averaged luminance of the expander section 211 output.

FIG. 20d depicts the spatially averaged output pattern of rays 209 of FIG. 20c. Output rays 209 issue from exit-plane 210 of the expander 211. It is much easier to use this averaged luminance function for all rays than to account for inhomogeneities due to LED chips 204, 205, and 206 of FIG. 20b, as well as to diffuse-white cup-reflector 208.

The particular proportions of the expander 211 of FIG. 20c is somewhat larger than the minimum possible, further restricting its output angle. Also, this emission is non-ideal in that the intensity is nonuniform as well.

FIG. 20d graphs the average output luminance of the expander section 211, with all three LEDs emitting. This graph is key to a preferred method of calculating proper patterns of sub-wavelength roughness. Although this graph was obtained by a computer ray-trace, goniophotometric measurements could supply such data as well. Curve 2001 gives the relative luminance as a function of off-axis angle, while curve 2002 gives the cumulative intensity with off-axis angle. This curve will be used to calculate illumination inside the ejector section.

In order to evaluate the effects of this narrowed distribution for a particular roughness function σ(x), the illuminance function I(x) is calculated from next to the expander section (x=0) all the way to the middle of the ejector section. The geometry of the cylinder ensures that incidence angle is preserved as view-factor rays are sent out from a viewpoint on the inside of the dielectric material, making it easy to calculate how many bounces each ray undergoes before it arrives at x=0. From its angle of arrival at exit plane 210 of FIG. 20c.

Figure 20E:
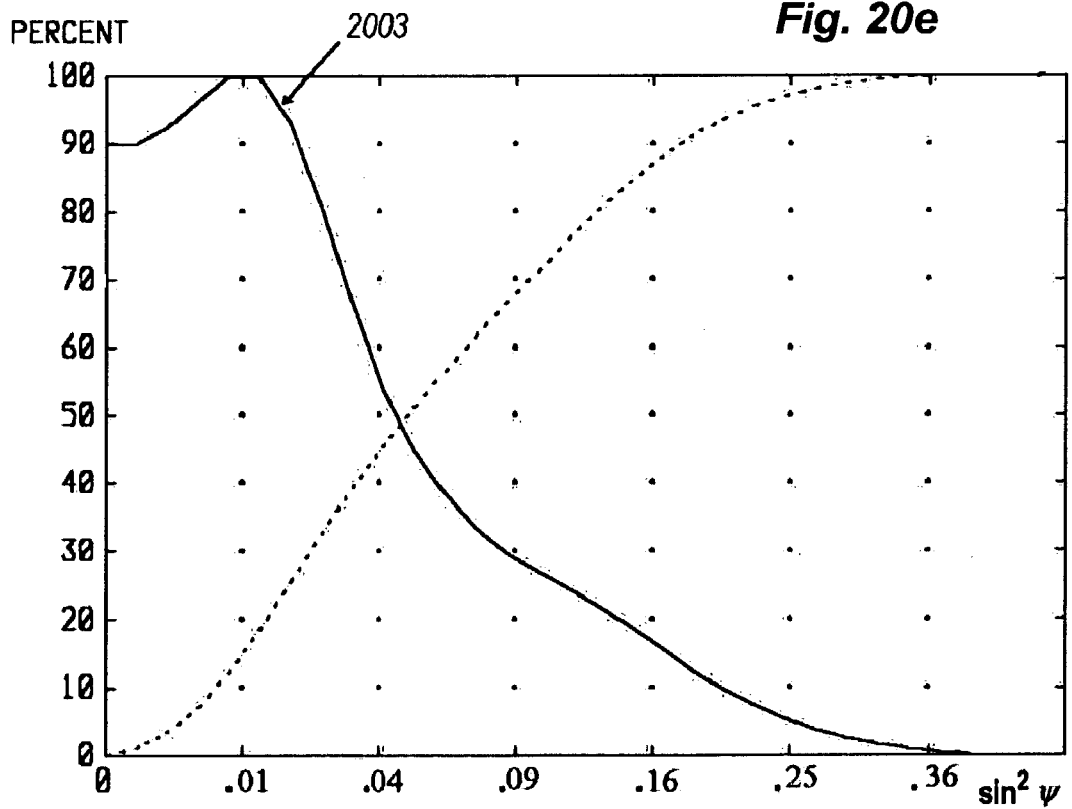
FIG. 20e is a graph showing the same luminance of FIG. 20d with sine squared.

Referring next to FIG. 20e, shown is a graph depicting the same luminance of FIG. 20d with sine squared.

Referring next to FIG. 21a, shown is a diagram of a unit sphere of directions 2100 depicting a method of calculating radiant reception by the method of the unit sphere of direction.

FIG. 21a depicts the unit-hemisphere method of illumination calculation. Unit hemisphere 2100 is symmetrical about surface normal 2101, which is normal to elemental surface patch $dA_1$. Illumination from distance surface $A_2$, including elemental patch $dA_2$, is evaluated on unit circle 2102 via sphere projection $A_s$ including elemental area $dA_s$, with $dA_s = dA_2 \cos \theta_2/S^2$. The projection of $A_2$ onto $A_s$ thus accounts for distance S and inclination $\theta_2$ of surface $A_2$. To account for the effect of inclination $\theta_1$ of rays from $dA_2$, sphere projection A2 projects to area Ab on unit circle 2102, with elemental area $dA_s$ multiplied by $\cos \theta_1$. This methodology is applied to the interior surface of the ejector 213.

Referring next to FIG. 21b, shown is a diagram depicting an equatorial plane of the same unit sphere of FIG. 21a, with circles of sin θ from 10 to 90° from the local surface normal inside a cylinder.

FIG. 21b depicts the unit circle 2102 of FIG. 21a. It represents the projected view from point 190 of FIG. 19. It also represents the inside surface of the ejector tube 213 of FIG. 20a. Outer circle 2190 represents the local tangent plane, 90° from the local surface normal. Concentric circles 2180, 2170, 2160, to 2110 represent angles $\theta_n$ of 80°, 70°, 60°, to 10° from the surface normal, respectively, with their radii equal to their sines. Instead of circle 2140, however, circle 2139 is shown, representing the critical angle $\theta_c$ at n=1.59, the refractive index of transparent polycarbonate, a widely used injection-molding plastic for the present invention. Circle 2139 corresponds to ray-cone 192 of FIG. 19.

Figure 22:
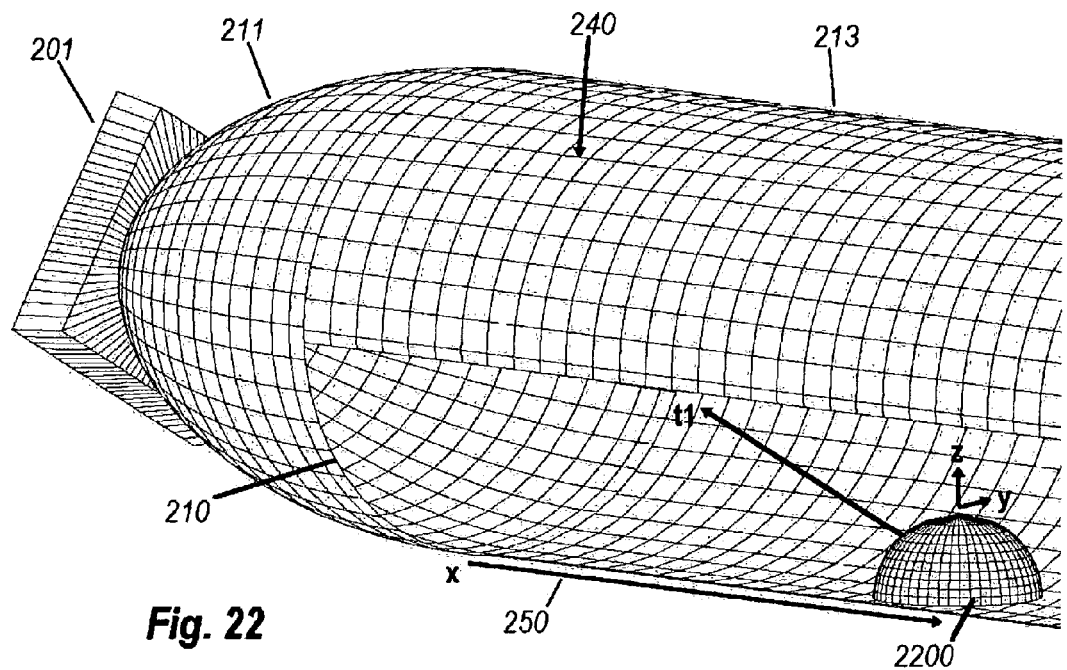
FIG. 22 is a partial side perspective cut-away view of the cylindrical ejector of FIG. 20a showing how the unit sphere of directions is placed inside the cylindrical ejector.

Referring next to FIG. 22, shown is a partial side perspective cut-away view of the cylindrical ejector 213 of FIG. 20a showing how the unit sphere of directions is placed inside the cylindrical ejector 213 of FIG. 20a.

Shown is the LED package 201, the expander section 211 with periphery 210, and the ejector cylinder 213. Directional hemisphere 2200 is used for the calculation of illumination at distance 250 along the x-axis from periphery 210. The z-axis is towards the center of the cylinder and the y-axis is lateral therefrom. Cylindrical mathematical grid 240 helps visualize the surface of the ejector cylinder 213. Ray vector t1 intercepts the opposite side of the ejector cylinder 213 from the center of directional hemisphere 2200.

Figure 23A:
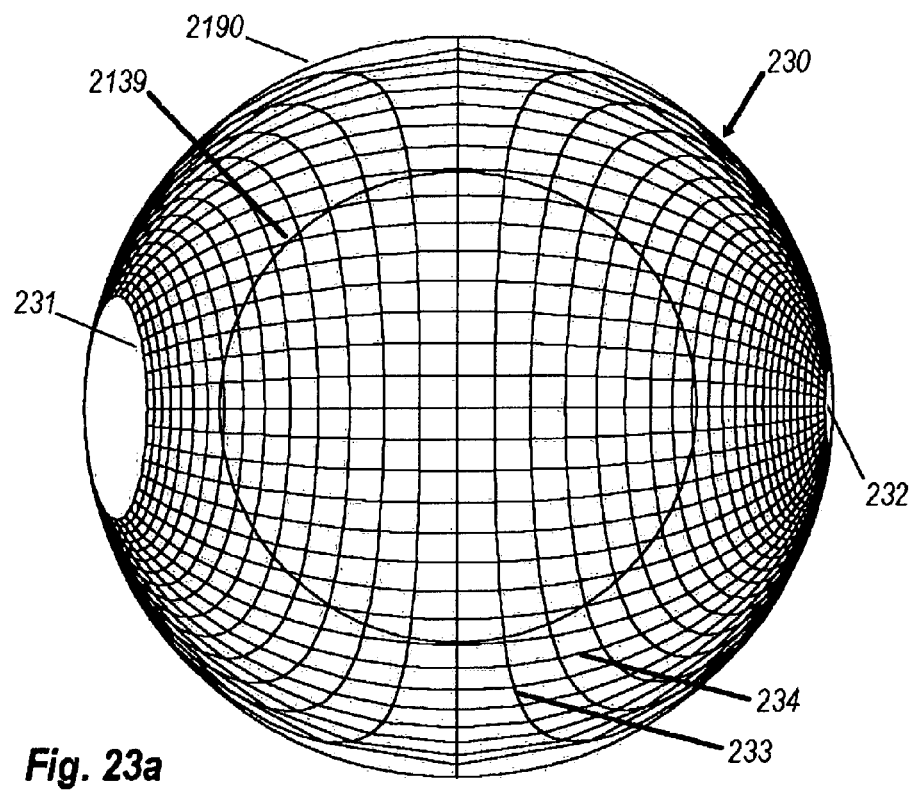
FIG. 23a is a diagram showing the equatorial plane of projected directions, as an interior view of a cylindrical ejector according to an embodiment of the present invention.

Referring next to FIG. 23a, shown is a diagram depicting the equatorial plane of projected directions, as an interior view of the cylindrical ejector 213.

FIG. 23a recapitulates unit circle 2190 of FIG. 21a, as well as critical-angle circle 2139. Curvilinear grid 230 is the projection of cylindrical grid 240 of FIG. 22 upon hemisphere 2200. Oval 231 is the projection of periphery 210 in FIG. 22 as seen from 1.5 diameters away. Opposite and much smaller oval 232 is the projection of the other expander section 212 of FIG. 20a, much farther away. Exemplary circumferential line 233 and exemplary axial line 234 are elements of curvilinear grid 230. Light shining out of oval 232 will contribute to local illumination in accordance with the area $A_v$ of 232 weighted by its luminance.

Figure 23B:
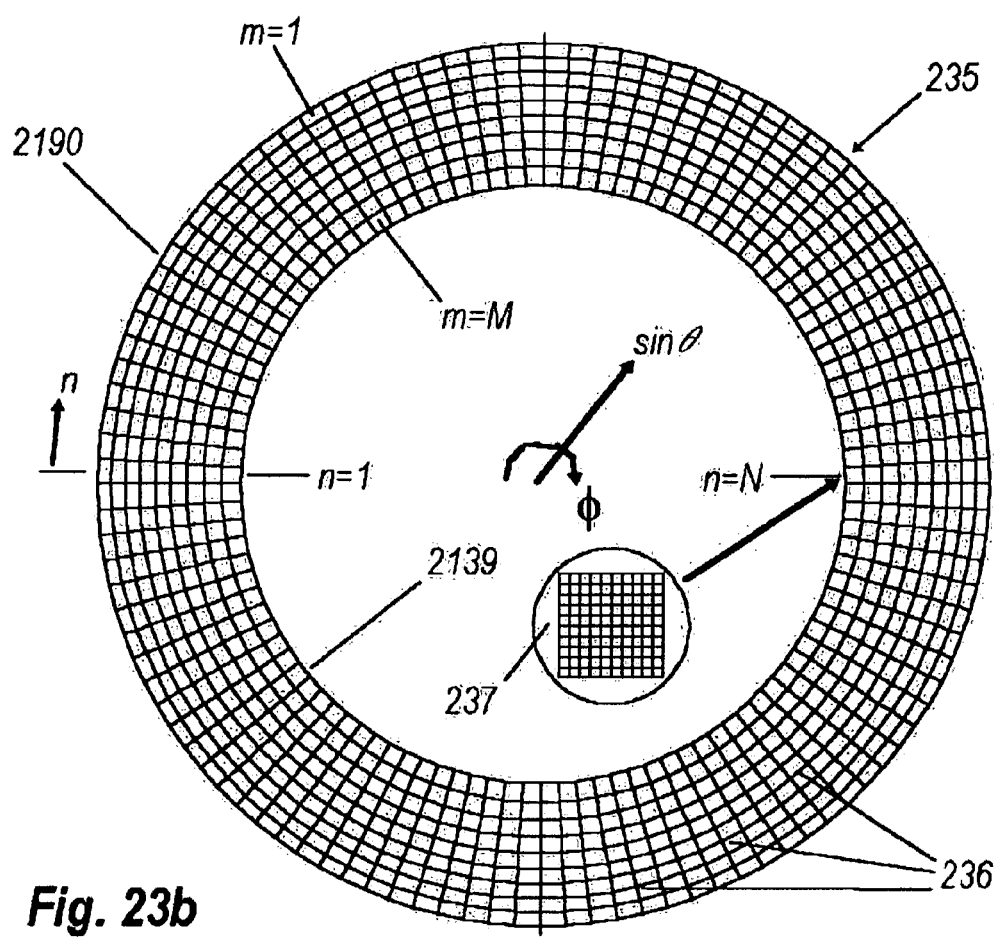
FIG. 23b is a diagram showing an equal-flux subdivision of the angular space of light rays trapped within a cylindrical ejector by total internal reflection according to an embodiment of the present invention.

Referring next to FIG. 23b, shown is a diagram depicting an equal-flux subdivision of the angular space of light rays trapped within the cylindrical ejector 213 by total internal reflection according to an embodiment of the present invention.

FIG. 23b has unit circle 2190, representing all possible directions of rays and identical to that of FIG. 23a, but evenly subdivided by radial grid 235, with radius $\sin\theta$ and polar angle $\Phi$. Grid 235 extends from ring m=1 at critical-angle circle 2139 to ring m=M at periphery 2190. Circumferential index n extends from n=1 to oppositely situated n=N. Incidence angle $\theta(m)$ is given by $\sin\theta = \sqrt{(0.4+0.6\ m/M)}$ and polar-angle is $\Phi = n/N$. These M rings and N spokes divide half of this annular zone of direction-space into MN (here 540) evenly-spaced and nearly square cells 236. A square shape makes for uniform sampling. Only a semi-annulus need be considered, due to the bilateral symmetry of the cylinder. A computer-implemented calculation using such a grid would use at least a hundred times the few drawn here for the sake of clarity, essentially by subdividing grid 235, as shown in magnified close-up 237. Each cell 236 accounts for a fixed portion (1/MN) of the 60% of the area of the unit circle 2190 that is outside circle 2139.

Because incidence angle is preserved for rays inside a cylinder, it is only from the directions represented by cells within grid 235 that guided light can come, and it is only this light that will be scattered by the inside surface of the ejector 213, thereby generating perceived brightness. As a projected solid angle of area 0.3/MN, each of cells 236 multiplies the luminance L(m,n) of light coming from its direction, so that I(m,n)=0.3L(m,n)/MN is the illuminance contribution of that cell. The sum total $\Sigma$I(m,n), of the illuminance contributions from all MN cells, gives the local illuminance I(x) at that distance x from the expander section 211 of FIG. 22. When the specular reflectivity is $R_{spec}(x)$, as listed above being determined by sub-wavelength roughness $\sigma(x)$, the brightness of the ejected light is $B(x)=I(x)R_{diff}(x)$.

To calculate the specular luminance L(m,n) of the cells of FIG. 23b, a reverse ray-trace is done for each cell. One ray per cell is sent out from the observation point on the inside surface of the ejector section 213, at a distance x from the exit plane of the expander section 212 of FIG. 20a. For coordinates y across the cylinder and z into it, the direction cosines of the ray are x1(m,n)=$\sin(\theta)\cos(\Phi)$=$\cos(n\pi/N)\sqrt{[1-(0.6\ m/M)]}$
y1(m,n)=$\sin(\theta)\sin(\Phi)$=$\sin(n\pi/N)\sqrt{[1-(0.6\ m/M)]}$
z1(m,n)=$\cos(\theta)$=$\sqrt{(0.6\ m/M)}$ The factor 0.6 describes light guided by a medium of refractive index n=1.581. This factor would be altered by a different refractive index n, to the value $1-(1/n^2)$.

A ray sent in direction of cell (m,n) will travel distance t1 to interception with the interior wall, given by t1(m,n)=2z1/(z1²+y1²)

This is the distance to the ray's first bounce, at coordinate xB=x−x1(m,n)t1. If xB<0 then there is no bounce and the ray is in oval 231 of FIG. 23a. Thus the ray's luminance, L(m,n), is given by FIG. 20d, at an off-axis angle $\cos^{-1}$(x1(m,n)). Reading off curve 2003 of FIG. 20e gives the value L(x1). The number nB of bounces of a ray at distance x from the expander section 211 is nB=trunc(t1/x)

Figure 23C:
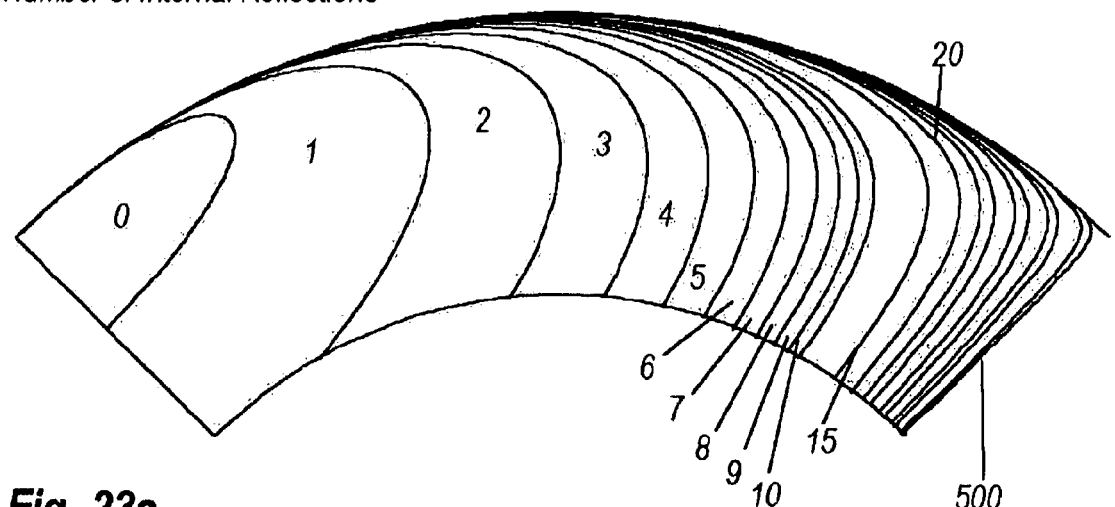
FIG. 23c is a close-up view of the upper left quadrant of FIG. 23a, labeled according to number of reflections, from 0 to 500.

Referring next to FIG. 23c, shown is a close-up view of the upper left quadrant of FIG. 23a, labeled according to number of reflections, from 0 to 500. At each bounce, the local diffuse reflectance $R_{diff}$(xB) reduces ray luminance. Thus these nB bounces multiply their diffuse reflectance values to reduce luminance according to L(m,n)=L(x1)$\Pi^{nB}$R(xB)

The particular luminance function of FIG. 20d tends to give little or no luminance for incidence angles over 30°. A cylinder of n=1.58, however, will trap all rays coming out of the expander section 211 to 50.8° from its axis. An ejector diameter only 30% larger than LED cup 208 would enable the expander section 211 to cover such a wide angle, in accordance with the conservation of etendue. Practical considerations, however, dictate a diameter several times that of the 2.4 mm of cup 208 of FIG. 20b. This means a narrower angular distribution than the maximum±±41°. The narrower distribution of FIG. 20d means that the endmost parts of an ejector section mostly determine specular illumination. This advantageously reduces the mathematical sensitivity of perceived brightness to small changes in the form of the monotonic increase of sub-wavelength roughness with distance x from the ejector section 213.

In the situation of light guiding, internal reflection is not subject to deliberate sub-wavelength scattering so there would be no need for grid 235 of FIG. 23b. Every cell 236 would have luminance equal to the undiminished expander-section luminance L(x1). With scattering by sub-wavelength roughness $\sigma$(x), however, ray luminance L(m,n) decreases with every internal reflection, as scattering takes it toll at each of nB bounce points. Illuminance I(x) is constant with x when there is no roughness, but with roughness $\sigma$(x), illuminance I(x) will decrease with distance x from the expander section 211, as guided light is lost to scattering. Accordingly, roughness $\sigma$(x) must increase with x so that the fraction $R_{diff}$(x) of scattered light will increase in compensation, keeping brightness B(x) approximately uniform along the ejector section 213.

The numerical implementation of this method is straightforward, especially with the abovementioned 30° angular restriction of FIG. 21c. Using the 13:1 aspect ratio depicted in FIG. 20b, the method disclosed herein gives a total illuminance at x=0 that is equivalent to 695 full cells, out of a total of 27,000 cells from $\Phi$=0 to $\Phi$=90°.

Figure 24:
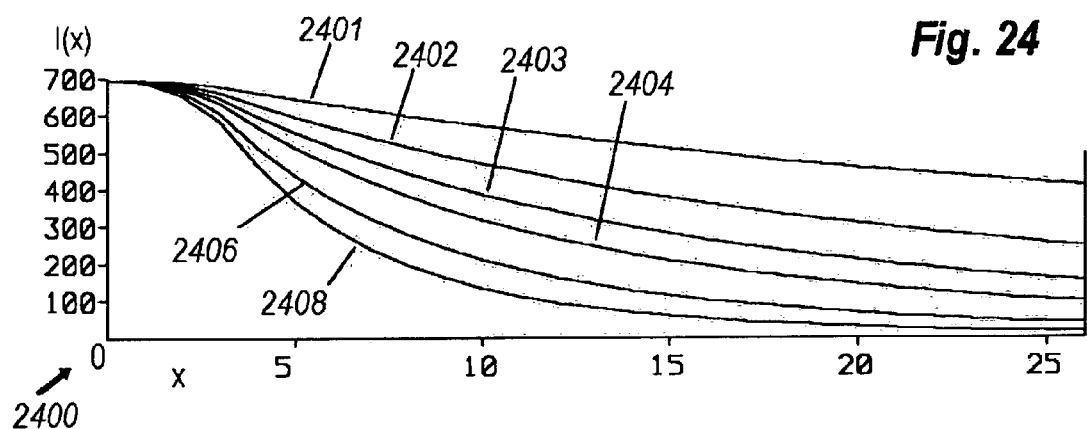
FIG. 24 is a graph of one-lamp specular illuminance for different values of diffuse reflectance according to an embodiment of the present invention.

Referring next to FIG. 24 shown is a graph of illuminance for different values of diffuse reflectance according to an embodiment of the present invention.

Shown is graph 2400 of first-pass specular illuminance I(x) along the full length of the ejector section 213 of FIG. 22. Curve 2401 is for diffuse reflectance $R_{diff}(x)=0.1$, while curves 2402, 2403, 2404, 2406, and 2408 are respectively for values 0.2, 0.3, 0.4, 0.6, and 0.8. The values of I[26] at the right ends of these curves represent unextracted light that re-enters the expander section 211 from the other end. Because some of this light is absorbed by the LED chips 203–205 of FIG. 20A, there will be a return factor $R_{exp}$. This returned light adds to the original light coming out of the expander section 211 of FIG. 20*c*. This causes each curve of FIG. 24 to be multiplied by a factor $$F = 1 + R_{exp}I\{26\}/I[0] + \{R_{exp}I\{26\}/I[0]\}^2 + \ldots$$
$$= 1/\{1 - R_{exp}I\{26\}/I[0]\}$$

Brightness is calculated using the multiplied illuminance from both expander sections:

B(x)=F $R_{diff}(x)$ [I(x)+I(A−x)]

Figure 25:
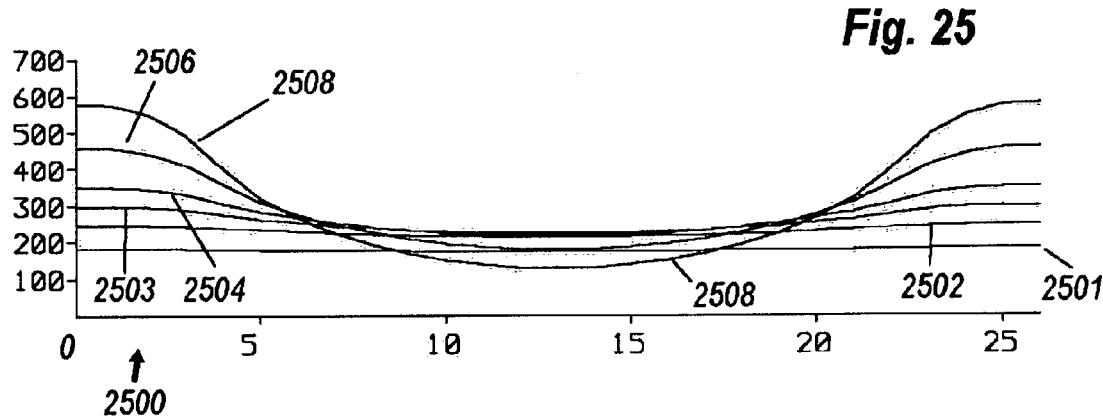
FIG. 25 is a graph of brightness for different values of diffuse reflectance from two-lamp specular illuminance according to an embodiment of the present invention.

Referring next to FIG. 25, shown is a graph of brightness for different values of diffuse reflectance according to an embodiment of the present invention.

Shown are the results of the calculation above in graph 2500, with brightness curves 2501 through 2508 corresponding respectively to diffuse reflectance values 0.1 through 0.8. Curve 2503 has the highest central value I[13]. This indicates that a good initial value for $R_{diff}(0)$ is about 0.3, with increasing values towards the center.

Figure 26:
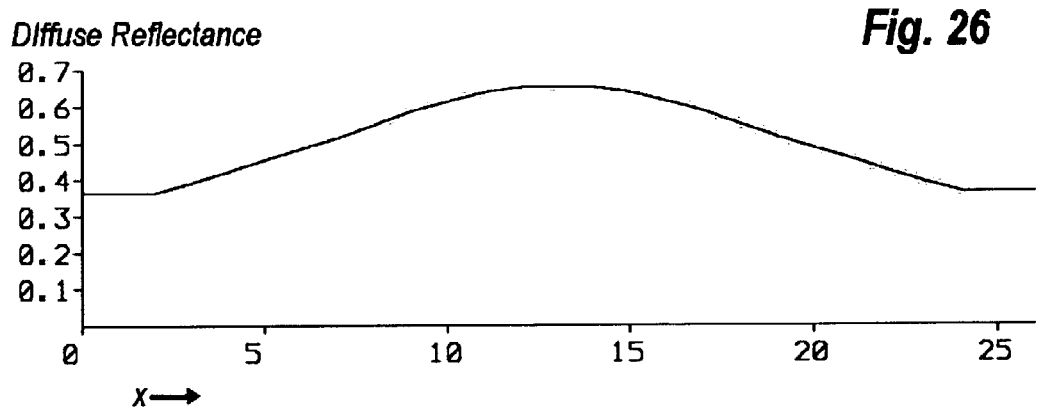
FIG. 26 is a graph showing a linear distribution of diffuse reflectance that gives uniform brightness as calculated by the view-factor method disclosed herein according to an embodiment of the present invention.

Referring next to FIG. 26, shown is a graph depicting a linear distribution of diffuse reflectance that gives uniform brightness according to an embodiment of the present invention.

Shown is a distribution of diffuse reflectance that gave a constant brightness of 285. This result would be a zero-order estimate of output brightness, with only specular light as its source of light to be scattered. But the 60% of the scattered light that is trapped within the ejector will add a diffuse illuminance $I_D(x)$ along its inside surface. According to FIG. 23*a*, everything outside circle 2139 will have diffuse luminance, including oval 231 representing the expander section 211 of FIG. 15.

Although the expander section 211 does not scatter light itself, most scattered light going into it will be retroreflected back into the ejector 213, excepting only the chips. Thus diffuse illuminance will vary little with x, tending to make first-order illuminance smoother than the zero-order estimate. Several more orders will add diminishing amounts of illuminance, as the diffusely scattered light specularly recirculates and is rescattered. Thus the zero-order brightness BT(x) needn't be absolutely uniform in order for the final brightness to be satisfactorily uniform.

Both uncorrelated and correlated roughness, with calibrated σ, are available via diamond-turning treatment of the ejector 213 shape in a metal master-part. This part could form a mold using conventional replicant mold-making. A preferred method of diamond-turning the master part in metal with calibrated sub-wavelength roughness is sonic vibration of the diamond tool to an amplitude-level equal to σ(x), using a wideband white-noise signal to provide uncorrelated roughness.

While the invention herein disclosed has been described by means of specific embodiments and applications thereof, numerous modifications and variations could be made thereto by those skilled in the art without departing from the scope of the invention set forth in the claims.

What is claimed is:

1. An optical device for spatially displacing and redistributing a radiant output of a light emitter that emits a substantially hemispherical emission of light, the optical device comprising:
    a lower transfer section having a transfer section top end and a transfer section bottom end; and
    an upper ejector section disposed upon the transfer section top end,
    wherein at least a portion of each of the upper ejector section and the lower transfer section is constructed of a transparent dielectric,
    wherein the light emitter is disposed at the transfer section bottom end,
    wherein the lower transfer section is adapted to transmit the light emitted by the light emitter substantially via total internal reflection to form a reconstituted emission of light directed into the upper ejector section, and
    wherein the upper ejector section is adapted to redistribute the reconstituted emission of light into a solid angle of external directions.

2. The optical device of claim 1 wherein the solid angle is greater than one steradian.

3. The optical device of claim 1 wherein the light emitter is a light-emitting diode.

4. The optical device of claim 1 wherein the light emitter comprises a plurality of light-emitting diodes disposed about a centroid.

5. The optical device of claim 4 wherein the light emitter further comprises a reflector cup.

6. The optical device of claim 1 wherein the lower transfer section has a centerline and an external surface with a vertical cross-sectional profile in the shape of two arcs of an ellipse,
    wherein the ellipse has a vertical major axis, a horizontal minor axis, a lower focus and an upper focus,
    wherein each of the two arcs extends in a generally vertical direction from a first elevation corresponding generally to the lower focus to a second elevation corresponding generally to the upper focus,
    wherein the centerline is approximately parallel with the vertical major axis and is spaced apart from the vertical major axis, and
    wherein the light emitter is disposed on the centerline at about the first elevation.

7. The optical device of claim 6 wherein the vertical major axis runs one of through the outer edge of the luminar perimeter of the light emitter and outside of the outer edge of the luminar perimeter of the light emitter.

8. The optical device of claim 6 wherein the transfer section top end has a cross section that is generally circular in shape.

9. The optical device of claim 6 wherein the transfer section top end has a transfer section cross section that is generally elliptical in shape.

10. The optical device of claim 6 wherein the upper ejector section is spherical.

11. The optical device of claim 6 wherein the upper ejector section comprises an indented section of a sphere.

12. The device of claim 1 further comprising;
    a base can disposed below the light emitter, the base can containing power and control electronic means for the light emitter, the base can having an electrically conductive side and an electrically separate end-means of opposite electrical polarity from the conductive side, the base can having thermally conductive paths for heat generated by the light emitter.

13. The device of claim 12 further comprising a transparent enclosure disposed on top of the base can, the enclosure surrounding the upper ejector section, the lower transfer section and the light emitter.

14. The device of claim 13 further comprising a parabolic reflector surrounding said transparent enclosure and having a focus on said upper ejector section.

15. The device of claim 14 wherein the upper ejector section has a diffusive surface.

16. An optical device for distributing a radiant output of a light emitter, comprising:
   an expander section; and
   a cylindrical ejector section having an ejector section diameter;
   wherein said expander section is constructed of a substantially transparent material and operable for receiving said radiant output and spatially widening said radiant output while narrowing said radiant output least down to an angular range corresponding to the ejector section diameter substantially via total internal reflection; and
   wherein said cylindrical ejector section is coupled to said expander section and constructed of substantially transparent material and operable for receiving and ejecting said angularly narrowed radiant output via a graded sub-wavelength surface roughness of the cylindrical ejector section.

17. The optical device of claim 16 further comprising a planar mirror extending across a distal end of said ejector section.

18. The optical device of claim 16 further comprising at a distal end of said ejector section, a second expander section and a second light emitter optically coupled to said distal end of said ejector section.

19. The device of claim 18 wherein said graded sub-wavelength surface roughness is highest on a perimeter of said ejector section at an equal distance from both of said expander sections, and lowest in proximity to said expander sections.

20. An optical device for spatially displacing and redistributing a radiant output of a light emitter adapted for the substantially hemispherical emission of light, the optical device comprising:
   a lower transfer section having a transfer section top end and a transfer section bottom end; and
   an upper ejector section disposed upon the transfer section top end,
   wherein the lower transfer section further comprises a lower minor section with an expanding profile and an upper dielectric section with a contracting profile,
   wherein at least a portion of the upper dielectric section and at least a portion of the upper ejector section are constructed of a transparent dielectric,
   wherein the light emitter is disposed at the transfer section bottom end,
   wherein the lower transfer section is adapted to reconstitute the light emitted from the light emitter into the upper ejector section, and
   wherein the upper ejector section is adapted to redistribute the reconstituted light into a substantially solid angle of external directions.

21. The optical device of claim 20 wherein the upper dielectric section is adapted to transmit the light substantially via total internal reflection.

* * * * *

UNITED STATES PATENT AND TRADEMARK OFFICE
CERTIFICATE OF CORRECTION

PATENT NO. : 7,021,797 B2
APPLICATION NO. : 10/461557
DATED : April 4, 2006
INVENTOR(S) : Miñano et al.

Page 1 of 1

It is certified that error appears in the above-identified patent and that said Letters Patent is hereby corrected as shown below:

Claim 1, column 18, line 5, delete "that emits a" and insert --adapted for the--.

Claim 12, column 18, line 62, delete "comprising;" (semicolon) and insert --comprising:-- (colon).

Claim 16, column 19, line 20, after "output" insert --at--.

Claim 20, column 20, line 17, delete "minor" and insert --mirror--.

Signed and Sealed this

Second Day of January, 2007

JON W. DUDAS
*Director of the United States Patent and Trademark Office*